United States Patent [19]
Knudsen

[11] Patent Number: 5,781,138
[45] Date of Patent: Jul. 14, 1998

[54] SYSTEM AND METHOD FOR GENERATING A SIGMA-DELTA CORRECTION CIRCUIT

[75] Inventor: Niels Knudsen, Austin, Tex.

[73] Assignee: National Instruments Corporation, Austin, Tex.

[21] Appl. No.: 772,785

[22] Filed: Dec. 23, 1996

[51] Int. Cl.[6] ........................................... H03M 1/06
[52] U.S. Cl. ........................................... 341/143; 341/120
[58] Field of Search ........................................... 341/143, 118, 341/120, 155; 375/27

[56] References Cited

U.S. PATENT DOCUMENTS 5,101,205   3/1992   Yasuda ................................. 341/155

OTHER PUBLICATIONS

Candy, James C. and Temes, Gabor C., *Oversampling Delta–Sigma Data Converters*, 1992, pp. 227–228.
Candy, James C. and Temes, Gabor C., *Oversampling Delta–Sigma Data Converters*, 1992, pp. 192–195.

*Primary Examiner*—Brian K. Young
*Attorney, Agent, or Firm*—Conley, Rose & Tayon; Eric A. Stephenson; Jeffrey C. Hood

[57] ABSTRACT

A system and method for reducing linearity errors in a delta-sigma converter. The linearity errors in the delta-sigma converter are modeled by generating a set of digital signals representative of an inputted sine wave. The set of digital signals are low-pass filtered and subjected to a fast Fourier transform algorithm to generate a frequency domain representation of the sine wave. Thereafter, a net linearity error spectrum is removed from the frequency domain representation and inverse Fourier transform back into the time domain. The filtered set of digital signals are also sorted into subsets of digital signals where each signal in a subset corresponds to a particular output of a delta-sigma modulator contained within the delta-sigma converter. A fast Fourier transform algorithm is applied to each of the filtered subsets of digital signals to generate a frequency domain representation thereof. Specific linearity errors are generated by applying an inverse Fourier transform algorithm to each of the specific linearity error spectrums in the frequency domain representations of the filtered subsets of digital signals. Thereafter, linearity error correction coefficients are generated as a function of the net linearity error and the specific linearity errors. The linearity error correction coefficients are used to generate entries in a look-up table where the entries are adjustable by digital outputs of the delta-sigma modulator. The look-up table is used to correct digital signals outputted by the delta-sigma modulator prior to decimation and digital filter.

59 Claims, 21 Drawing Sheets

SYSTEM AND METHOD FOR GENERATING A SIGMA-DELTA CORRECTION CIRCUIT

FIELD OF THE INVENTION

This invention relates to the art of analog-to-digital (A/D) converters, and more particularly, to an oversampled A/D converter.

DESCRIPTION OF THE RELATED ART

Oversampled A/D converters, often denoted as "delta-sigma converters" or "sigma-delta converters" are well known in the art. Delta-sigma (D/S) converters have gained in popularity due primarily to their ability to realize high resolution analog-to-digital conversion in mixed signal VLSI processors. Until recently, however, the process technology needed to make these devices commercially viable has not been available. Now that smaller integrated circuit geometries are manufacturable, D/S converters will become even more prolific in certain types of the applications, especially mixed signal integrated circuits which combine the analog-to-digital (A/D) conversion, digital-to-analog (D/A) conversion, and digital signal processing (DSP) functions on a single chip.

The D/S converter is inherently an oversampling converter, although oversampling is just one of the techniques contributing to its overall performance. A D/S converter essentially digitizes an analog signal at a very high sampling rate (oversampling) in order to perform a noise shaping function. Digital filtering after the noise shaping allows the D/S converter to achieve a high resolution when compared with conventional A/D converters. Decimation is thereafter used to reduce the effective sampling rate back to the "Nyquist" rate. To gain an understanding of D/S converters, it is important to understand the operation of oversampling, noise shaping, digital filtering and decimation, the key concepts involved.

FIG. 1 shows, in block diagram form, a single bit D/S converter 10 commonly known in the art. The single bit D/S converter 10 includes a single bit D/S modulator 12 connected to a digital filter and decimation circuit 14. The D/S modulator 12 includes a summing node 16, a filter 18, a single bit A/D converter 20, and a single bit D/A converter 22. The D/A converter 22 is connected to the output of the A/D converter 20 and operates to provide feedback to the summing node 16. The summing node 16 includes a pair of inputs, one being connected to the output of the D/A converter 22 and the other being connected to analog input signal $V_{in}$.

In operation, the output of summing node 16 is low-pass filtered by filter 18 and subsequently converted into a single bit, digital signal by A/D converter 20. The single bit digital signal in turn is converted back into an analog signal by D/A converter 22 and subtracted from analog input signal $V_{in}$ at summing node 16.

The single bit D/S modulator 12 converts the input signal $V_{in}$ into a continuous serial stream of 1s and 0s at a rate determined by sampling clock frequency, $kf_S$. Due to the feedback provided by the D/A converter 22 the average value outputted by the D/A converter 22 approaches that of the input signal $V_{in}$ if the loop has enough gain.

FIG. 2A shows a schematic implementation of the single bit D/S converter of FIG. 1. In particular, FIG. 2A shows a single bit D/S converter 30 which includes a single bit D/S modulator 32 connected to a digital filter and decimation circuit 34. The single bit D/S modulator 32 includes a summing node 36, an integrator 38, a latched comparator 40 which functions as the single bit A/D converter, and a simple switching mode device 42 which functions as the single bit D/A converter.

Integrator 38 acts as a filter and has an amplitude response in the frequency domain proportional to 1/f, where f is the input frequency. Since the chopper like action of the clocked, latched comparator 40 converts the input signal to a high frequency AC signal, varying about the average value of the input $V_{in}$, the effective quantization noise at low frequencies is greatly reduced. In effect, low frequency quantization noise is "shaped" into higher frequencies. FIG. 2B shows the simulated noise density as a function of frequency of a D/S modulator. The y-axis is in dB and the x axis is in MHz. As can be seen, the lower noise frequencies are attenuated. The exact frequency spectrum of the resulting noise shaping depends on the sampling rate, the integrator time constant, and the order of the filter.

Clearly, a single bit, digital representation of an analog signal has very little resolution. The D/S modulator 32 of FIG. 2A is very difficult to analyze in the time domain because of the apparent randomness of the single bit nature of the data. For any given input value in a single sampling interval, data from the latched comparator 40 is virtually meaningless. Only when a large number of samples are averaged, will a meaningful value result. If the input signal $V_{in}$ is near positive full scale, it is clear that there will be more 1s than 0s in the bit stream. Likewise, for signals near the negative full scale, there will be more 0s than 1s in the bit stream. For input signals near the midscale, there will be approximately an equal number of 1s and 0s.

After the quantization noise has been shaped by the D/S modulator 32, the output of the D/S converter 30 is further processed by the digital filter and decimator circuit 34. The purpose of the digital filter is two fold. First, the digital filter acts as an anti-aliasing filter with respect to the final sampling rate, $f_S$. Second, the digital filter filters out the higher frequency noise produced by the noise shaping process of the D/S modulator 32. Final data reduction is performed by digitally resampling the filtered output using a process called decimation. Decimation is the process of resampling at a lower rate. Decimation can be viewed as the method by which redundant signal information introduced by the over-sampling process is removed.

FIG. 3 shows a multi-bit D/S converter 50 in block diagram form. The multi-bit D/S converter 50 includes a multi-bit D/S modulator 52 connected to a multi-bit digital filter and decimation circuit 54. The multi-bit D/S modulator 52 further includes a summing node 56, a filter 58, a multi-bit A/D converter 60, and a multi-bit internal D/A converter 62.

The multi-bit D/S modulator 50 of FIG. 3 operates similarly to the single-bit D/S converter of FIG. 1. The output of the summing node 56 is low-pass filtered by filter 58 and converted into a multi-bit digital signal by multi-bit internal A/D converter 60 operating at oversampling rate $kf_S$. The multi-bit D/A converter 62 is connected via a feedback loop between the output of the multi-bit A/D converter 60 and an input node of the summing node 56, whereby the analog signal output of the D/A converter 62 is subtracted from the analog signal input $V_{in}$. Again, the output of D/A converter 62 approaches that of the analog input signal $V_{in}$ due to the feedback involved. Digital filter and decimation circuit 54 removes quantization noise shaped into the higher frequencies and resamples the oversampled digital signal at rate $f_S$.

The multi-bit D/S converter 50 of FIG. 3 provides benefits over the single bit D/S converter 10 of FIG. 1. Namely, the multi-bit D/S converter 50 provides more resolution and less quantization noise. Additionally, the multi-bit D/S converter 50 is more stable than single bit D/S converters. However, the multi-bit D/S converter suffers from linearity errors introduced by the internal multi-bit D/A converter 62. Single bit D/S converters on the other hand do not produce linearity errors.

Linearity error is the inability of the multi-bit D/A converter to accurately translate a digital input value into an analog current or voltage. In other words, given a particular digital input, the resulting analog output of the multi-bit internal D/A converter 62 approximates the digital value but is not exactly equal to the digital value. In reality, the actual analog output differs from the digital input value by an amount equal to the linearity error.

FIG. 4 shows a graphical comparison of an ideal linear v.s. non-ideal, non-linear multi-bit D/A converter. The horizontal axis represents the codes or multi-bit digital signals applied to the inputs of both types of multi-bit D/A converters, ideal and non-ideal. The vertical axis represents the analog signal output therefrom. Line L represents the transfer function of the ideal or linear D/A converter. Line NL represents the transfer function of the non-ideal or non-linear D/A converter. Variations between the two lines represent the linearity errors. The distance between points on a vertical line through both line L and the line NL represent the linearity error produced by the non-ideal D/A converter for a particular input code. For example, if digital code x is input to both the ideal D/A converter and the non-ideal D/A converter, the respective outputs would be $Y_L$ and $Y_{NL}$. The difference in voltage $\Delta Y$ represents the linearity error corresponding to digital code x. This linearity error is viewed as noise and degrades the ultimate signal to noise ratio of the D/S converter which contains the non-linear D/A converter. This linearity error is static in nature and independent of frequency and voltage.

The source of linearity errors can be traced to the internal current generators of the multi-bit D/A converter. FIG. 5 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code inputted to the D/A converter 70. For example, switch $S_{N-1}$ is controlled by the most significant bit of the inputted digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 5 was an ideal 3 bit D/A converter, and a digital code inputted thereto equaled 111, the three ideal internal current generators 72 would generate 4, 2, and 1 units of current, respectively. However, internal current generators are rarely ideal. Given an input code 111, the non-ideal set of current generators, for example, might generate 4.05, 1.98, and 1.01 units of current, respectively.

The linearity error produced by the internal current generators can be further traced to a variety of causes, chief of which is the inability of integrated circuit manufacturers to form, in silicon, current generators having identical geometries. Several other causes can be related to the linearity error. Over time and use, the internal current generators may wear differently. Moreover, temperature variations may occur between the internal current generators. In any event, the physical differences between internal current generators in a D/A converter, even though slight, can produce significant errors in the translation of a digital input code into an analog equivalent.

Single bit D/A converters do not employ multiple current generators. As such, single bit D/A converters do not exhibit the non-linearity characteristics of multi-bit D/A converters. Accordingly, single bit D/S converters employing a single bit internal D/A converter, such as shown in FIG. 1, do not suffer from linearity errors. To this end, single bit D/S converters are advantageous over multi-bit D/S converters. Thus, while it is known that the resolution and stability of a multi-bit D/S converter is superior to that of a single bit D/S converter, single bit D/S converters are superior to multi-bit D/S converters to the extent that a single bit D/S converter produces less linearity error when compared to the linearity error produced by the multi-bit D/S converter. If it were not for the linearity errors caused by the internal multi-bit D/A converter, designers would generally prefer to use multi-bit D/S converters over single bit D/S converters.

It is desirable to have a multi-bit D/S converter in which the non-linearity produced by the internal D/A converter is removed or otherwise reduced. The present invention solves this problem and others by providing a multi-bit D/S converter which eliminates or otherwise reduces linearity errors.

SUMMARY OF THE INVENTION

The present invention comprises a system and method for deriving linearity error correction coefficients and constructing therefrom a linearity error correction circuit useful in enhancing resolution of a delta-sigma converter. The technique includes applying a known analog waveform, preferably a pure sine wave, to an input of a delta-sigma modulator contained within the delta-sigma converter, and generating digital signals representative of the pure sine wave. A number of the digital signals output from the modulator are recorded. These signals contain hidden information regarding the linearity errors associated with the delta-sigma converter. The linearity error information can be extracted and used in deriving the correction coefficients and constructing the linearity error correction circuit.

The hidden information needed to derive the correction coefficients can be obtained by first applying a Hanning window to the recorded digital signals representing the sine wave. The Hanning window operates to prevent unwanted spectral leakage from high frequencies into low frequencies. The method then preferably transforms the resulting digital signals into the frequency domain using a frequency domain transform algorithm such as a Fast Fourier Transform (FFT) algorithm. The resulting spectrum ideally should be zero at low frequencies, except for components at certain frequencies including those at D.C. and near the frequency of the input sine wave. However, because the delta-sigma modulator is non-ideal, other frequency components of the spectrum are non-zero. These unexpected, non-zero components are caused by non-linearities inherent in the delta-sigma converter in general and internal generators in the D/A converter in particular.

A net linearity error spectral content or spectrum, which represents an accumulation of specific non-linearities of the delta-sigma modulator in the frequency domain, is extracted by removing those frequency components which are expected to be non-zero, i.e.: (1) the D.C. component; (2) the components associated with a range of frequencies near the frequency of the input sine wave, the extent of the range being dependent on purity of the inputted sine wave; (3) the components at higher frequencies containing quantization noise; and (4) components at bins mirrored around the half sampling rate. Thereafter, an inverse frequency domain transform algorithm is applied to the remaining spectrum, resulting in a net linearity error in the time domain and designated as E. The net linearity error E represents an accumulation of individual linearity errors inherent in each individual generator in the D/A converter. The net linearly error is one portion of the hidden information needed to derive the correction coefficient.

Linearity errors associated with the individual generators are also needed to derive the correction coefficients. These linearly errors are preferably isolated by first sorting the recorded digital signals into subsets after application of the Hanning window. Each signal in a subset corresponds to an active state of one of the generators internal to the D/A modulator. The individual linearity errors, or specific linearity errors, are obtained by subjecting each subset of digital signals to the above procedure. In other words, a frequency domain transform is applied to each of the subsets to generate frequency domain equivalents thereof. Specific linearity error spectral contents or spectrums are extracted from each of the resulting spectrums by removing therefrom those components at frequencies which are expected to be non-zero, i.e.: (1) the D.C. component; (2) the components associated with a range of frequencies near the frequency of the inputted sine wave, the extent of the range being dependent on purity of the inputted sine wave; (3) the components at higher frequencies containing quantization noise; and (4) components at bins mirrored around the half sampling rate. Specific linearity errors, designated as a(m), are then generated by applying an inverse FFT to the remaining spectrum.

Finally, the linearity error correction coefficients c(m) are generated as a function of E and a(m). In the preferred embodiment, the coefficients c(m) are generated by iteratively minimizing a power content between the net linearity error E and the specific linearity errors a(m).

In an alternative embodiment, the linearity error correction coefficients c(m) can be calculated as a function of the net linearity error spectrum and the specific linearity error spectrums. This embodiment eliminates the need to convert the net linearity error spectrum and the specific linearity error spectrums into the time domain.

In another embodiment, the linearity error correction coefficients can be calculated directly from the time domain digital signals and the sub-sets of digital signals without any frequency domain conversions.

Once the coefficients are calculated, the linear error correction circuit may then be configured. The linearity error correction circuit preferably comprises a look-up table which maps digital values output from the delta sigma modulator to new, enhanced values which have reduced linearity errors. The new digital values are calculated as a function of the linearity error correction coefficients c(m).

The look-up table, once configured, is connected to the output of the delta-sigma modulator. The delta-sigma modulator which includes the linearity error correction circuit a summing node, a filter, a multi-bit internal A/D, a multi-bit D/A converter and a look-up table. The summing node is connected to an analog input signal. The filter applies a low pass function to the output of the summing node. The filtered signal is then converted into a digital equivalent by A/D converter. The D/A converter is positioned in a feed-back loop between the output of the A/D converter and an input of the summing node. Thus, the output of the A/D converter is translated into an analog equivalent and then subtracted from the connected analog input signal at the summing node. Due to the feed-back signal provided, the output of the D/A converter approaches that of the inputted analog signal, if the loop has enough gain. The look-up table is connected to the output of the A/D converter. The look-up table operates by translating the digital signal output of the A/D converter into an enhanced digital signal, i.e., digital signal with reduced linear error.

One advantage of the present invention is that it provides a delta-sigma converter with enhanced resolution.

Another advantage of the present invention is that it provides for a reduction in linearity errors in a delta-sigma converter.

Yet another advantage of the present invention is that it precludes the need of employing high precision internal digital-to-analog converters within the delta-sigma converter.

BRIEF DESCRIPTION OF THE DRAWINGS

A better understanding of the present invention can be obtained when the following detailed description of the preferred embodiment is considered in conjunction with the following drawings, in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Figure 7:
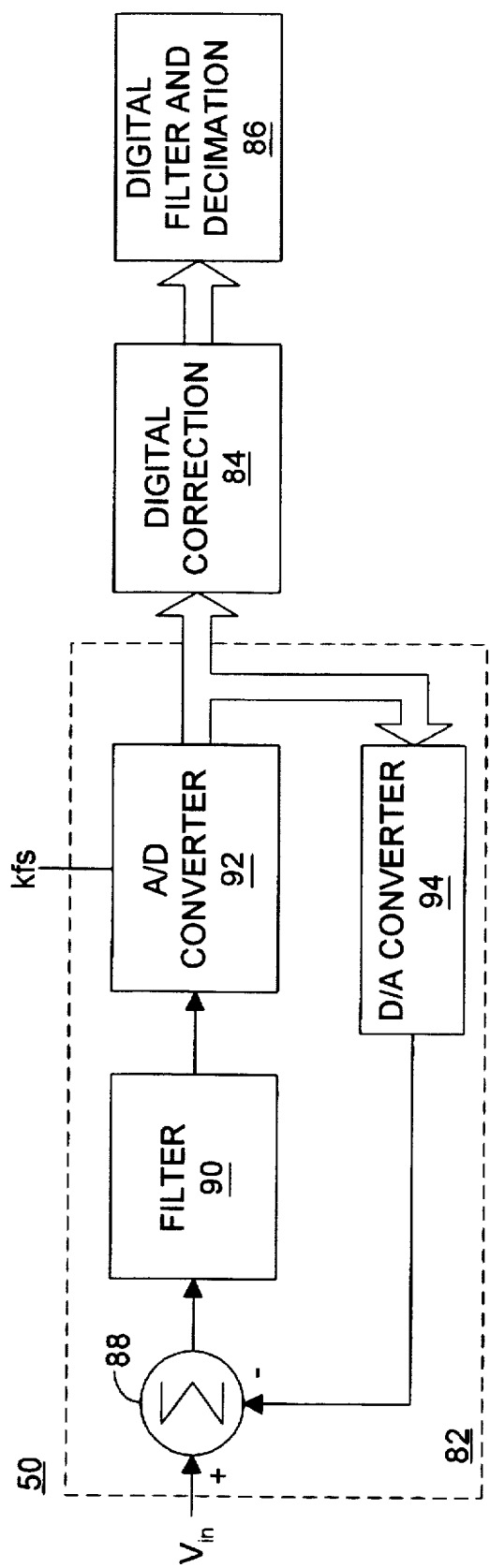
FIG. 7 illustrates a conventional multi-bit D/S converter employing the present invention.

FIG. 7 shows a multi-bit D/S converter 80 employing the present invention. The D/S converter 80 includes a multi-bit D/S modulator 82, a linear error correction circuit 84 according to the present invention, and a digital filter and decimation circuit 86. The linear error correction circuit 84 is placed in series between the D/S modulator 82 and the digital filter and decimation circuit 86. The digital filter and decimation circuit 86 operates substantially in the same way as prior art digital filter and decimation circuits. Namely, the digital filter and decimation circuit provides low-pass digital filtering and a resampling of the digital signals inputted thereto, where the resampling occurs at a rate $f_S$.

The D/S modulator 82 includes a summing node 88, a filter 90, a multi-bit internal A/D converter 92, and a multi-bit D/A converter 94. The present invention is shown as being employed in a first order, single pole D/S converter. However, the present invention is applicable to other types of D/S converters.

Figure 8:
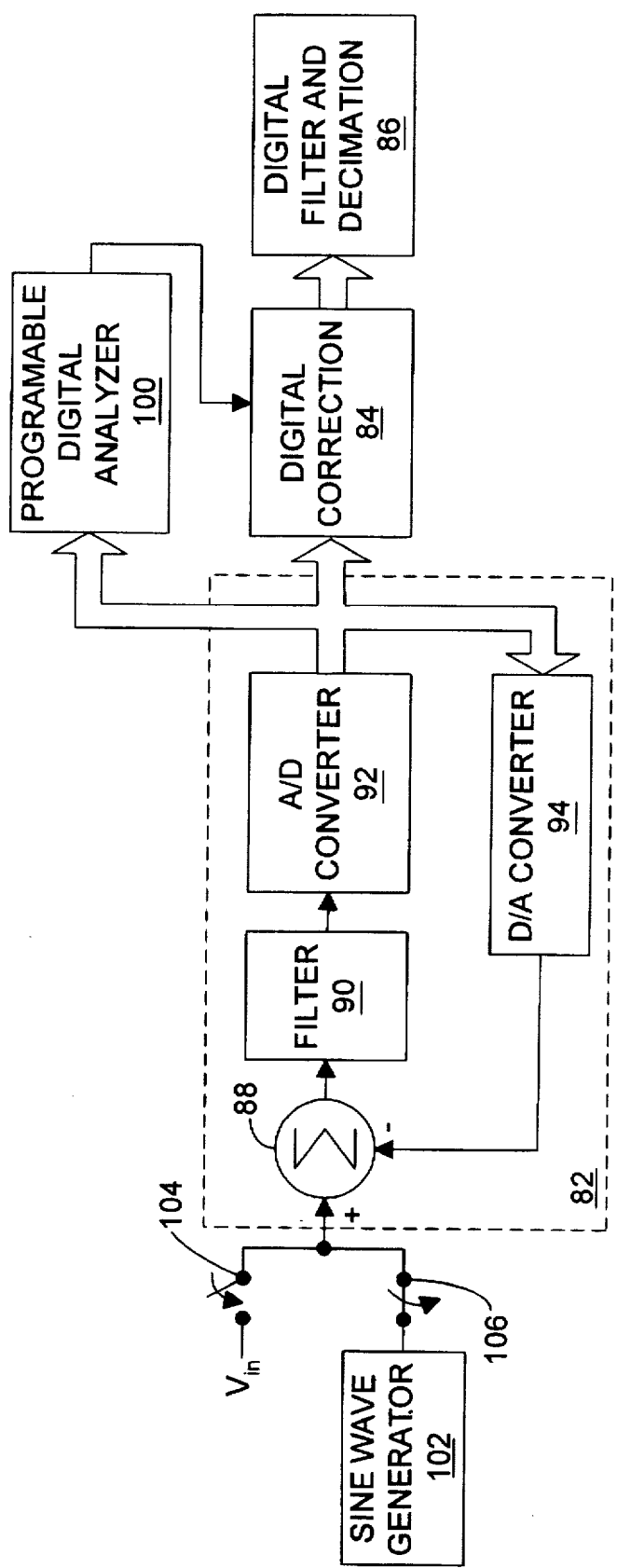
FIG. 8 illustrates a conventional multi-bit D/S converter employing the present invention.

The D/S modulator 82 shown in FIG. 8 performs in substantially the same manner as prior art multi-bit D/S converters. Namely, filter 90 applies a low-pass filter function to the output of summing node 88. The filtered signal in turn is converted into a digital equivalent by A/D converter 92. D/A converter 94 is positioned in a feedback loop between the output of the A/D converter 92 and an input of the summing node 88. Thus, the output of the D/A converter 94 is translated into an analog equivalent which is subtracted from analog input signal $V_{in}$ inputted to summing node 88. Due to the feedback signal provided, the output of the D/A converter 94 approaches that of the input signal if the loop has enough gain.

Linear error (L/E) correction circuit 84 is connected to the output of the D/S modulator 82. Digital signals generated by the D/S modulator 82 are corrected or linearized by the L/E correction circuit 84 before being digitally filtered and decimated. The L/E correction circuit 84 linearizes the D/S modulator 82 by removing or substantially reducing the linearity errors in output digital signals. The L/E correction circuit 84 removes or reduces linearity errors by adjusting the output of the D/S modulator 82 to compensate for the linearity error. In particular, in the preferred embodiment the L/E correction circuit 84 utilizes a look-up table to map values output from the D/S modulator 82 which have linearity errors, to new values with reduced linearity errors. Given that the L/E correction circuit 84 linearizes the D/S modulator 82, the D/S converter 80 employing the present invention ultimately produces a digital signal having reduced linearity errors and a higher resolution. Accordingly, the number of bits representing the digital output of the digital filter and decimator 86 can be enhanced or increased.

In the preferred embodiment, the gain of filter 90 is set sufficiently high for the following reasons. The transfer function for the D/S modulator 82 can be defined as:

$$A/(1+AB),$$

where A defines a gain of filter 90, and B defines a transfer function of D/A converter 94. If the gain A of the filter 90 is made sufficiently high at low frequencies, the transfer function of the D/S modulator 82 reduces to:

$$1/B.$$

According to the present invention, the L/E correction circuit 84 is configured to have a transfer profile substantially equal to B, and L/E correction circuit 84 thus offsets or otherwise reduces the linearity error introduced by the D/A converter, since the digital correction circuit 84 is connected in series with the D/S modulator 82.

FIG. 8 shows the D/S converter of FIG. 7 along with a programmable digital analyzer 100, a waveform generator such as sine wave generator 102 selectively connected to the input of the summing node 88, and a switch 104 for selectively connecting the analog input signal $V_{in}$ to the summing node 88. The programmable digital analyzer 100 is in data communication with L/E correction circuit 84. In accordance with the present invention, the digital programmable analyzer 100 is used to configure the L/E correction circuit 84 to have a transfer function substantially equal to B. In this mode, switch 104 is open thereby disconnecting analog input signal $V_{in}$ from summing node 88. Also switch 106 is closed to enable the waveform generator 102 to provide input to the summing node 88.

Figure 15:
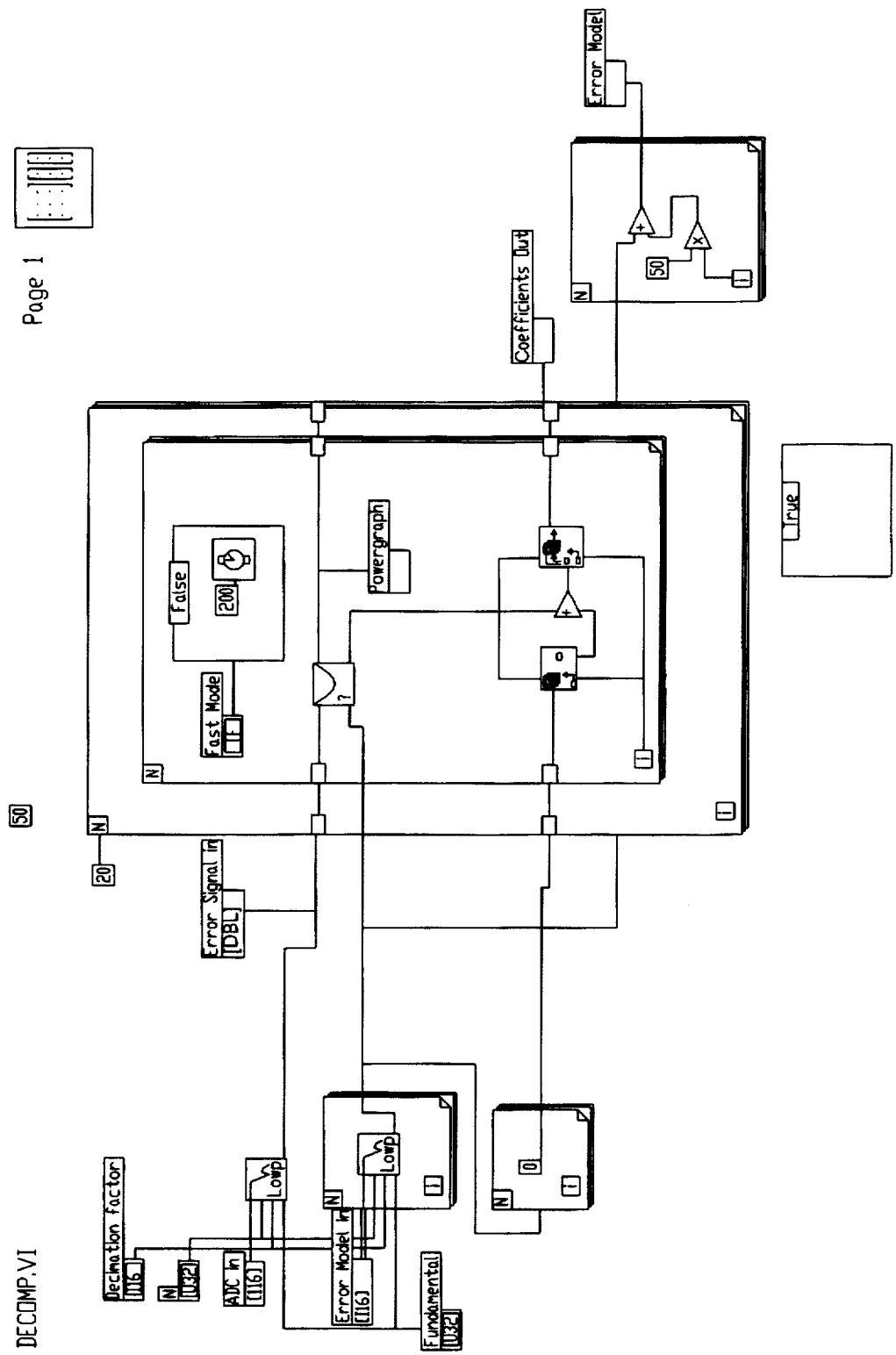
FIG. 15 illustrates one implementation of the programmable digital analyzer.
Figure 16:
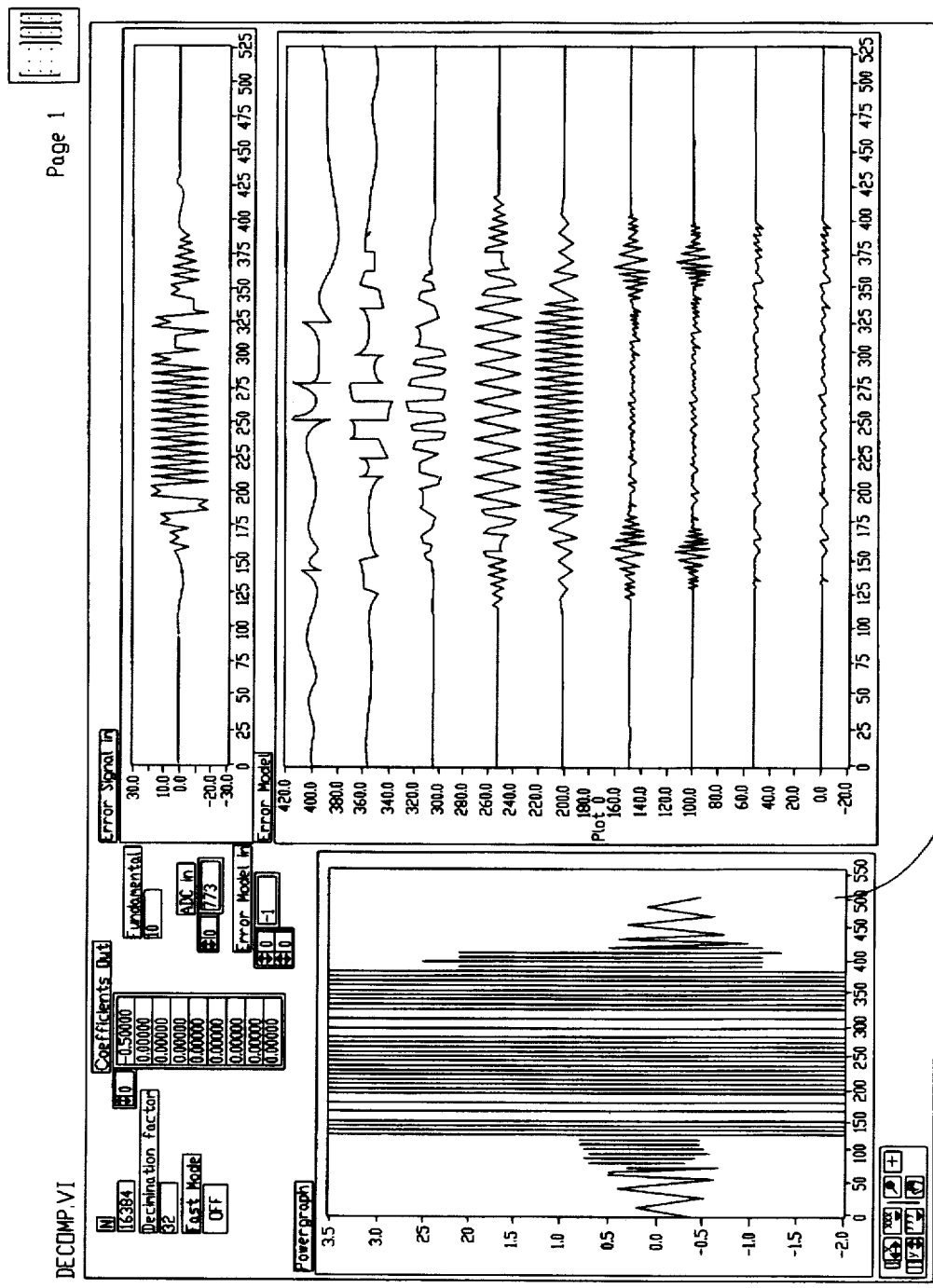
FIGS. 16–21 illustrate successive reductions in the power content of E using the iteration shown in FIG. 14.
Figure 17:
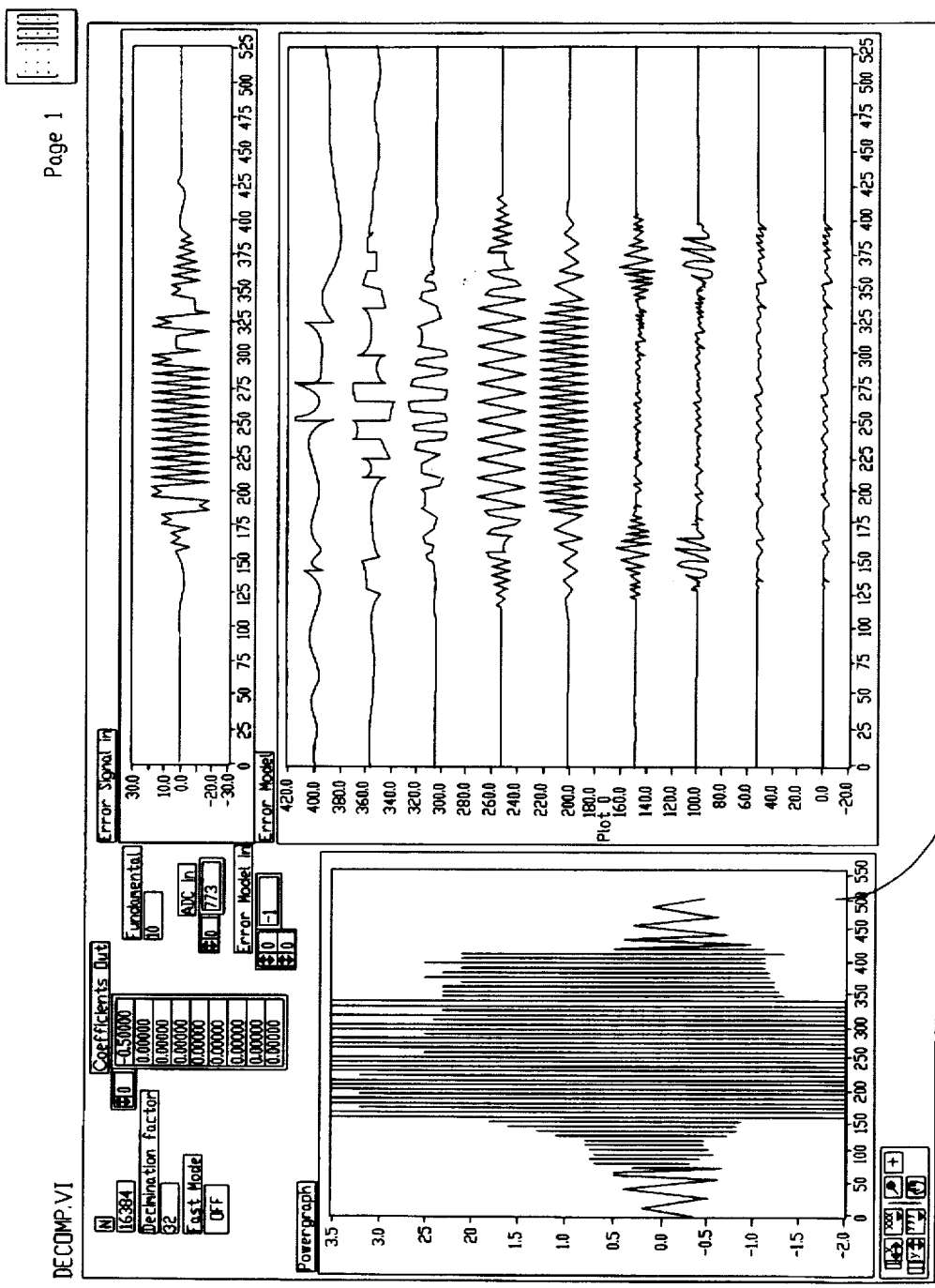
Figure 18:
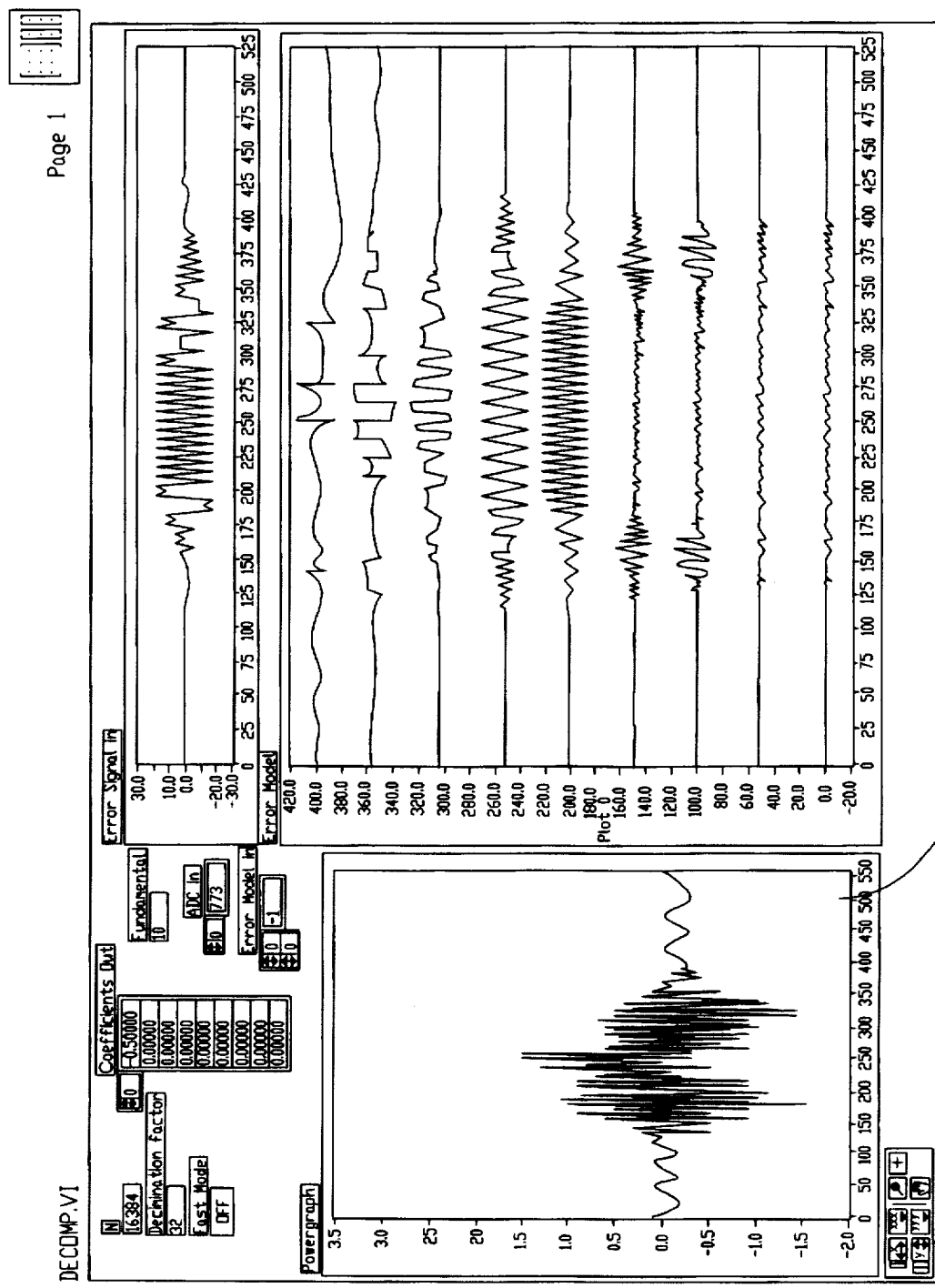
Figure 19:
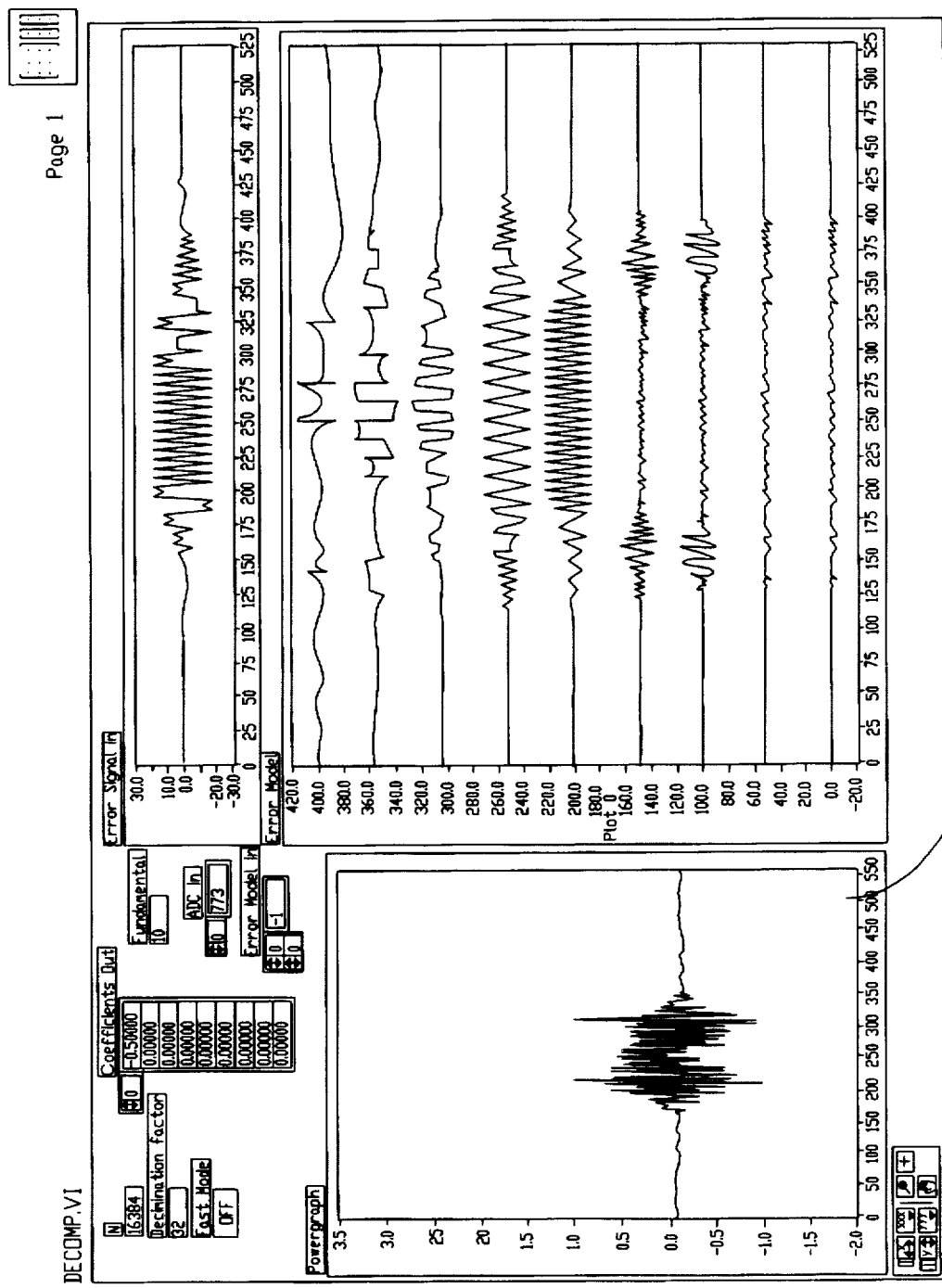
Figure 20:
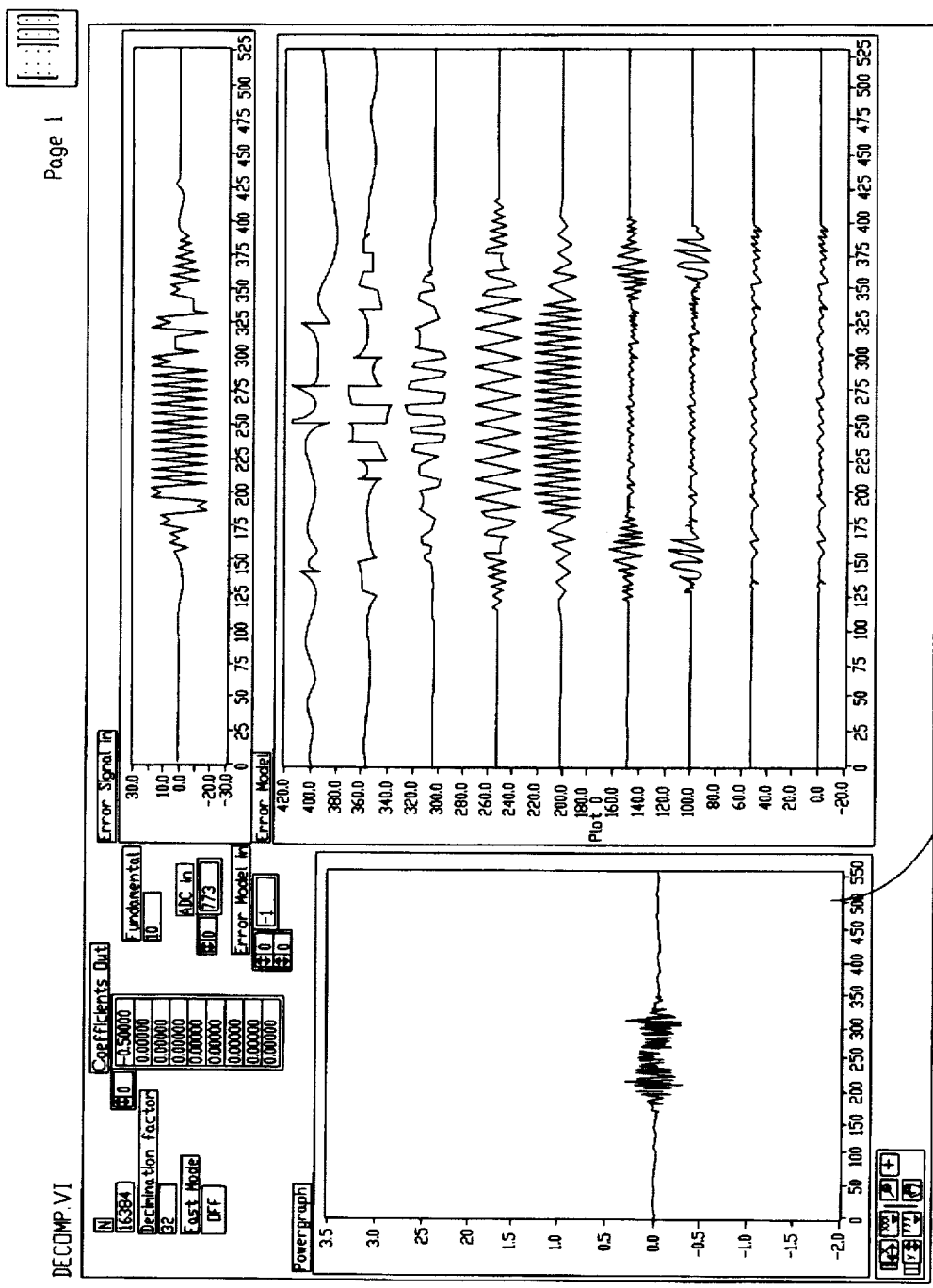
Figure 21:
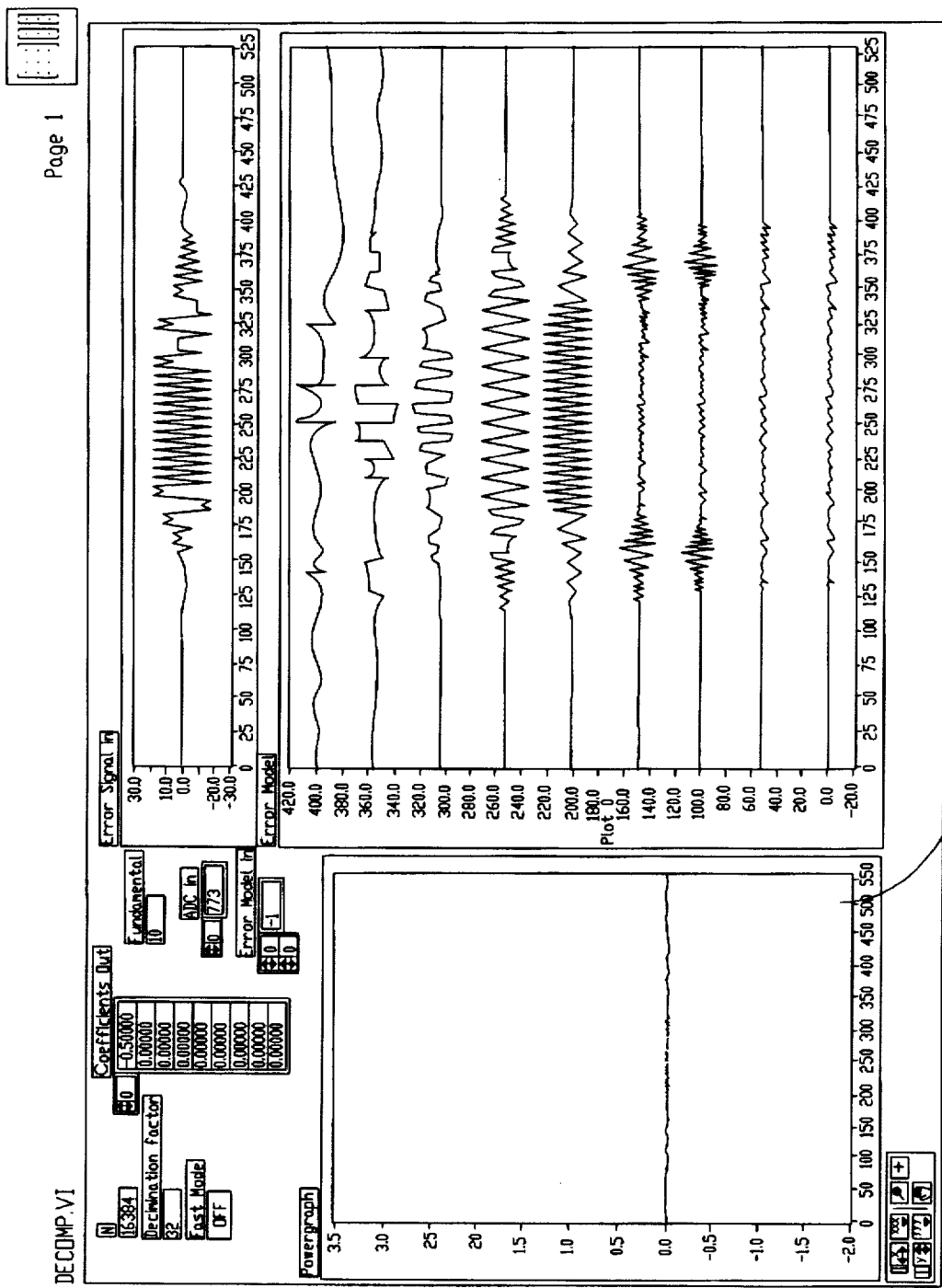

FIG. 15 shows a LabVIEW implementation of the programmable analyzer 100 (LabVIEW is a registered trademark of National Instruments, Corp.).

With continuing reference to FIG. 8 and 15, and with further reference to FIGS. 9 through 14, the L/E correction circuit 84 and programmable analyzer 100 will now be more fully explained.

Figure 9:
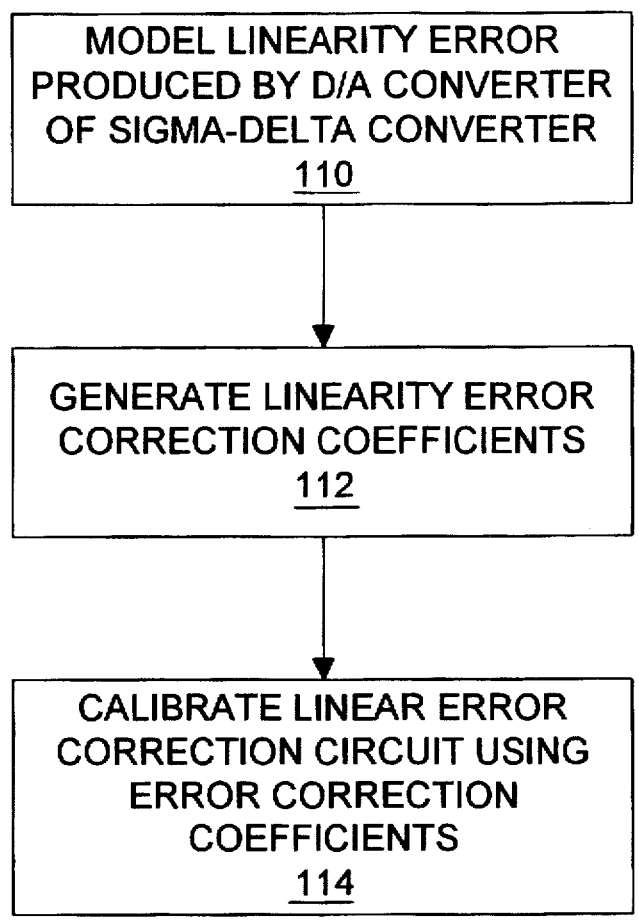
FIG. 9 is a top level flowchart which illustrates the method of the present invention.

FIG. 9—Top Level Flowchart

FIG. 9 shows, in general terms, application of the present invention to a conventional multi-bit D/S converter. In step 110 the digital programmable analyzer models the linearity error inherent in the D/A converter 94. Based on the linearity error modeling, the programmable digital analyzer 100 generates correction coefficients in step 112. Thereafter, in step 114, the linearity error correction coefficients are used to configure or calibrate L/E correction circuit 84. Once the L/E correction circuit 84 is properly configured, $V_{in}$ is applied to the delta-sigma converter input summing node 88. $V_{in}$ is digitally sampled, and the digital samples are provided to L/E correction circuit 84 which in turn translates the digital samples into signals with reduced linearity errors in the digital samples.

Figure 12:
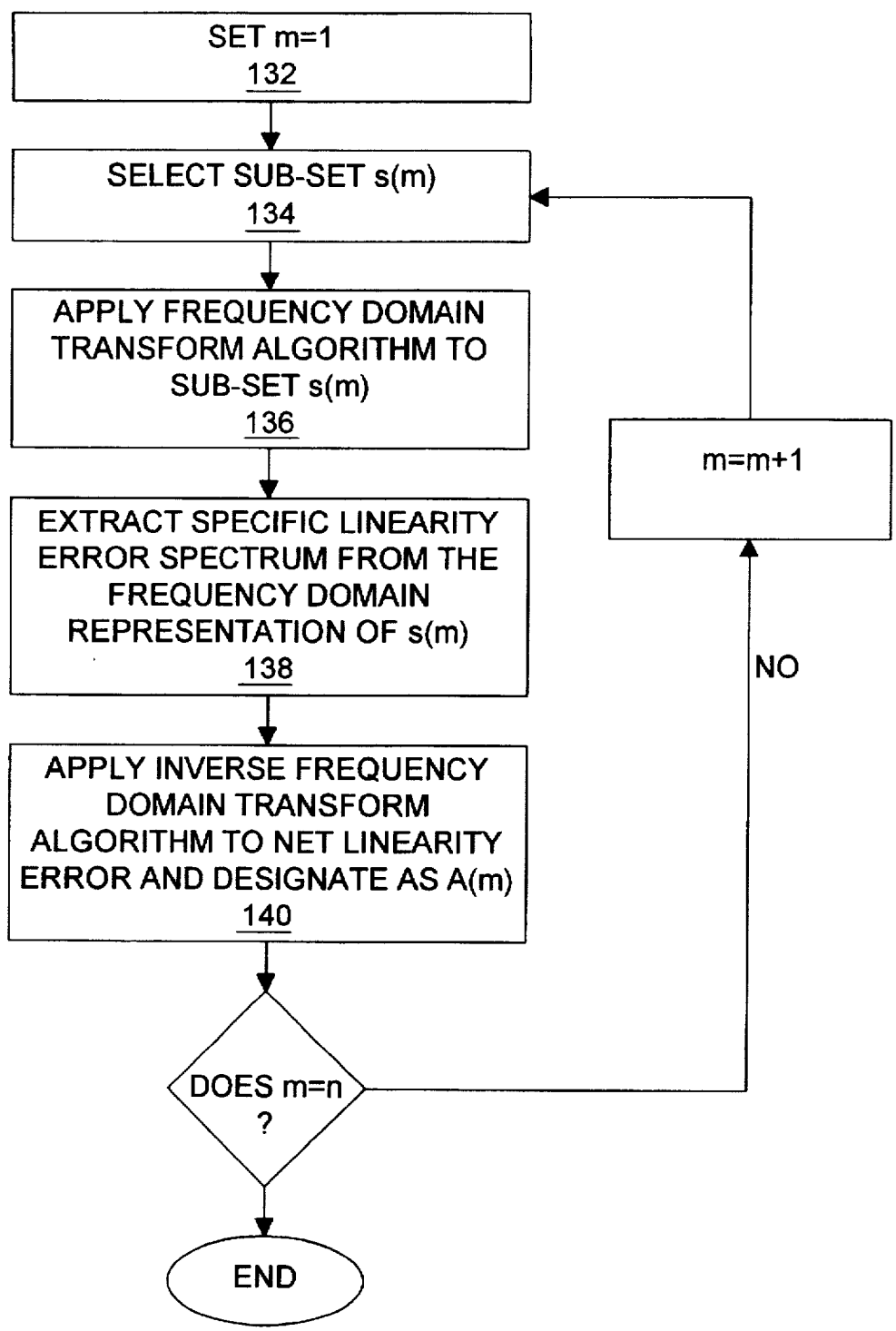
Figure 13:
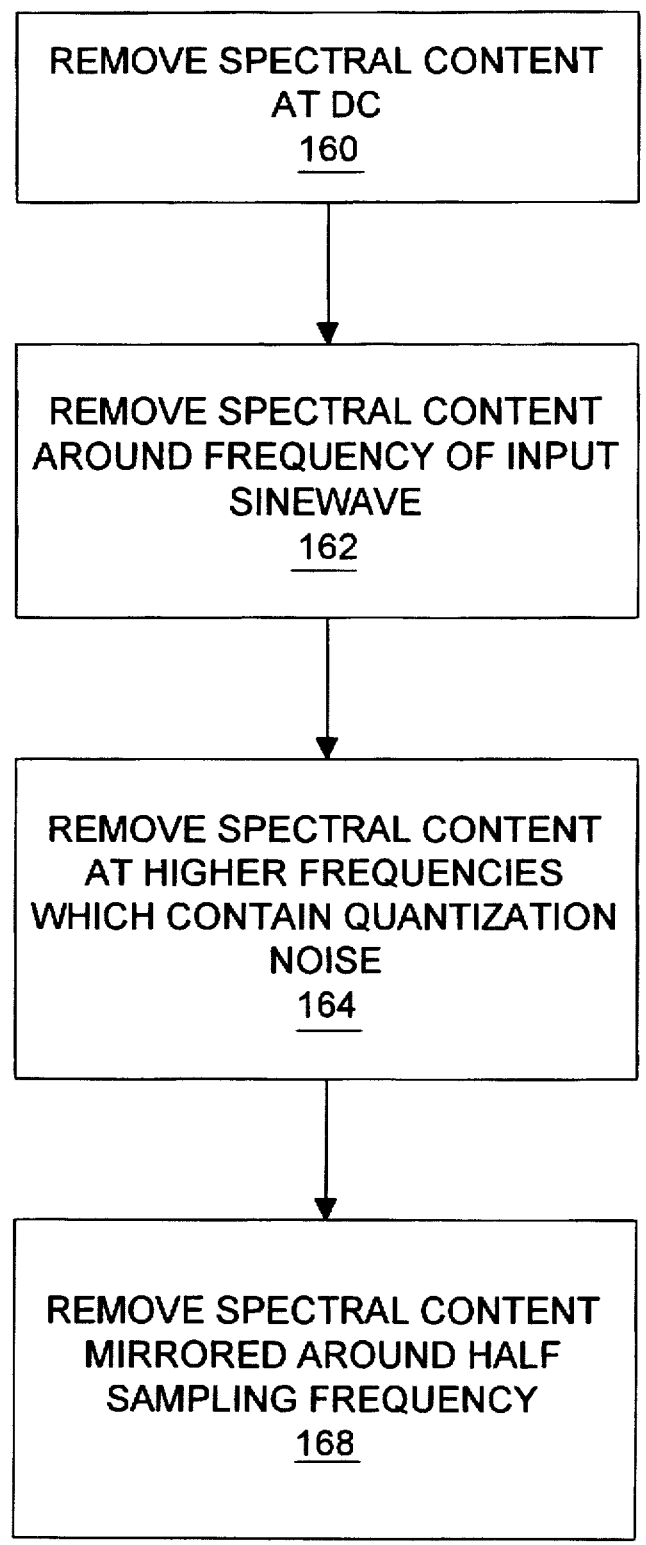
FIG. 13 is a more detailed flowchart which illustrates a method of extracting linearity error.
Figure 14:
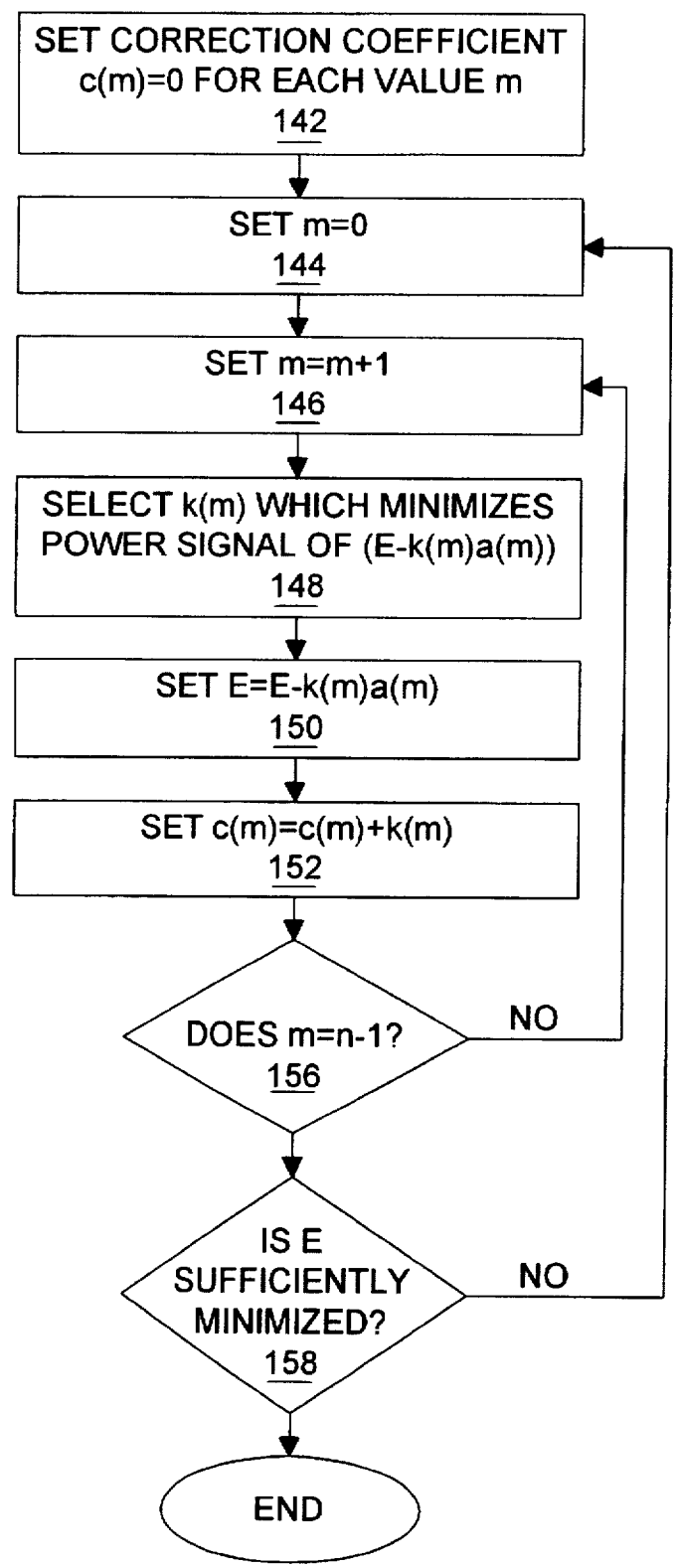
FIG. 14 is a flowchart illustrating generation of the linearity error correction coefficients.

FIGS. 10 through 14 are flowchart diagrams which illustrate how the linearity error is modeled in step 110, and how the linearity error correction coefficients are generated in step 112. More specifically, FIGS. 10–13 illustrate how the linearity error is modeled, and FIG. 14 illustrates how the linearity error correction coefficients are generated.

Figure 10:
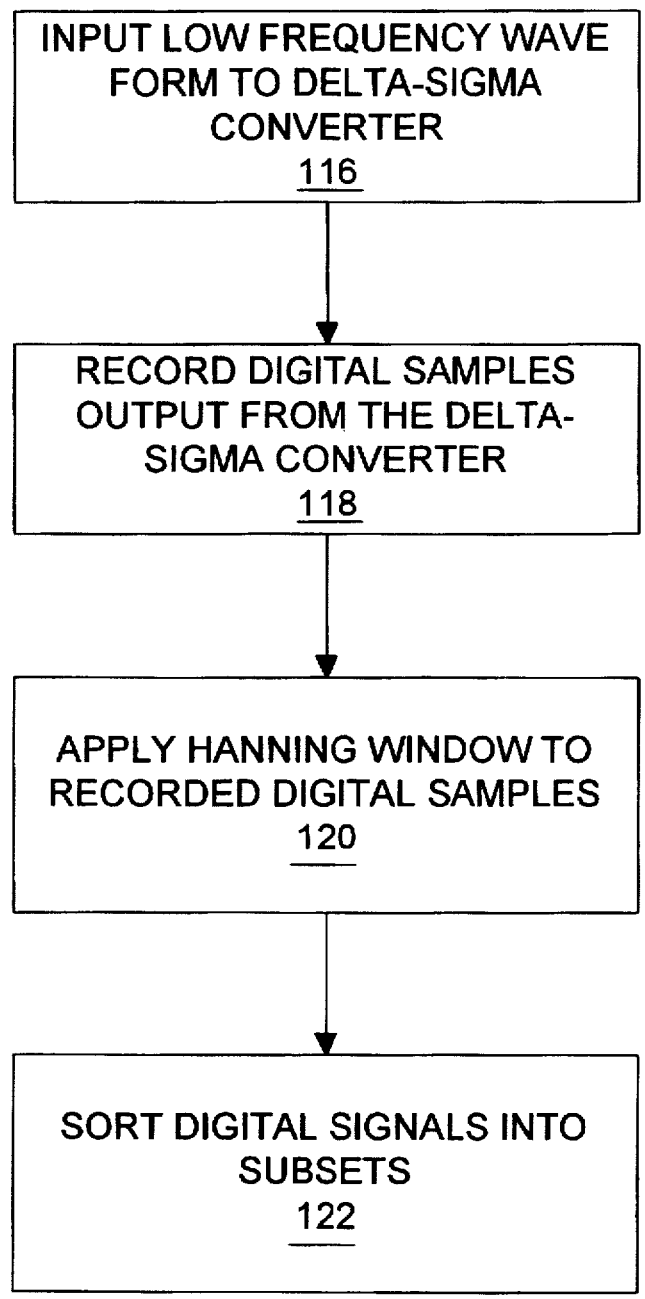
FIGS. 10–12 are a more detailed flowchart diagram illustrating how linearity errors are modeled or extracted according to the method of the present invention.
Figure 11:
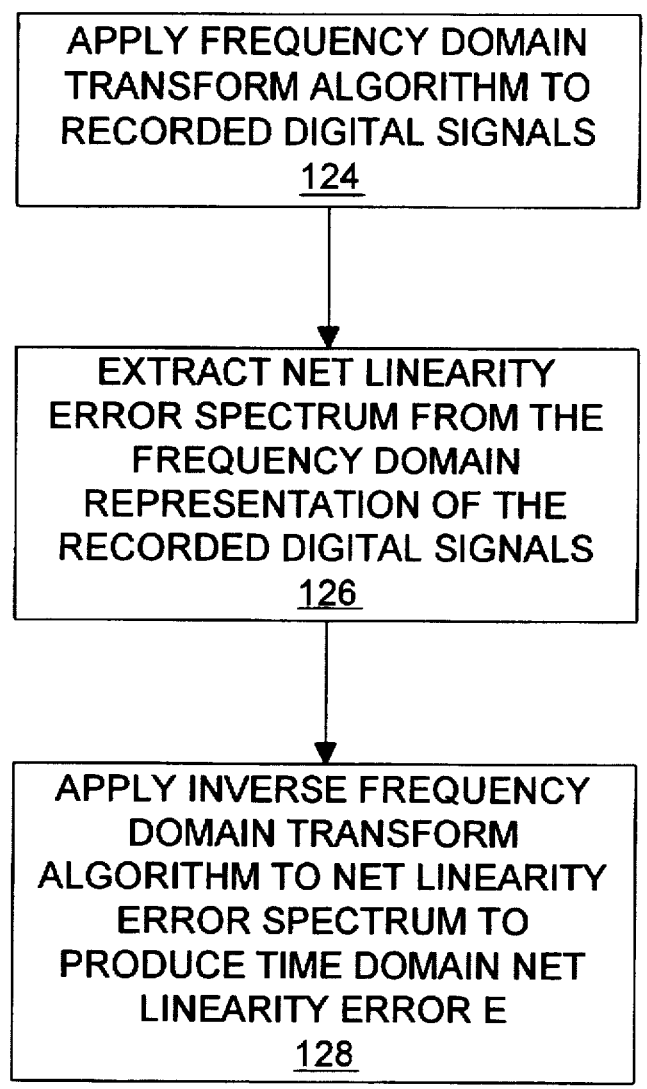

FIGS. 10–12: Modeling and Extraction of Linearity Errors

With continuing reference to FIG. 8 and with further reference to FIG. 10, at step 116, a known waveform is input to the D/S modulator 82 by selectively connecting the waveform generator 102 to an input of summing node 88. The waveform input to the D/S modulator 82 is preferably a pure sine wave, although other types of analog waveforms may be used. The pure sine wave is generated at a predetermined frequency $f_{SW}$.

In step 118, the programmable digital analyzer 100 collects and stores in memory a set S of digital samples of the output waveform generated by the D/S modulator 82. The recorded digital samples are subjected to a Hanning window to prevent spectral leakage of noise from high frequencies to low frequencies. Alternatively, a low pass filter may be applied to the set S of digital signals.

After application of the window, programmable digital analyzer 100 sorts the digital samples into subsets s(m) for m=1 to n at step 122. Each digital sample in a subset s(m) corresponds to a unique setting of a generator internal to the D/A converter 94. In a preferred embodiment of the present invention, n subsets of digital samples are selected, where n equals the number of current generators contained within the D/A converter 94. In this configuration, each digital sample in a particular subset s(m) corresponds to a single current generator being switched to a summing node within the D/A converter 94. Thus, each subset s(m) of digital samples contains linearity error information associated solely with a distinct, single current generator in the D/A converter 94. These sorted subsets are used in steps 132–140 of FIG. 12.

With reference to FIG. 11, and with continuing reference to FIG. 8, the programmable digital analyzer 100 applies a frequency domain transform algorithm to the recorded set S of digital samples at step 124, after the set S has been subjected to the Hanning window. In the preferred embodiment, the set S of digital samples are transformed using a Fast Fourier Transform algorithm.

Figure 1:
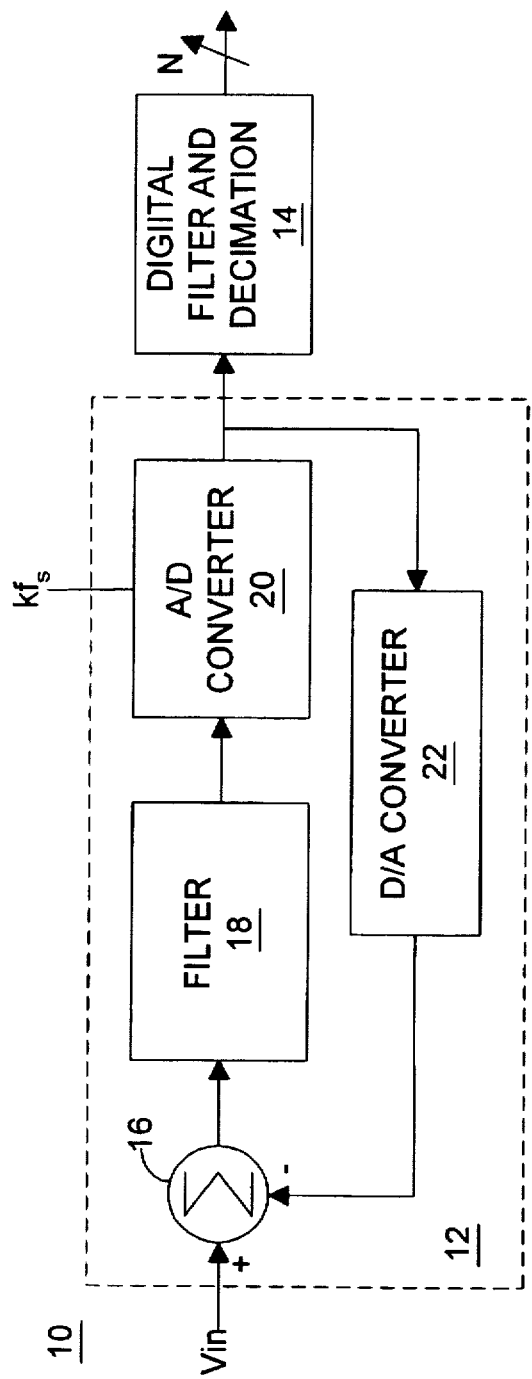
FIG. 1 represents a prior art single bit D/S converter in block form.
Figure 2A:
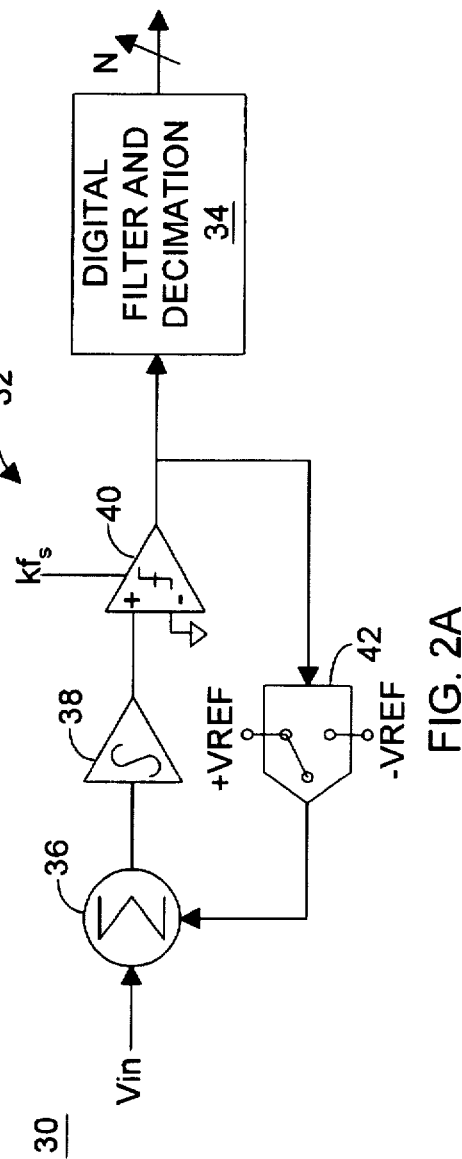
FIG. 2A represents a prior art single bit D/S converter in schematic form.
Figure 2B:
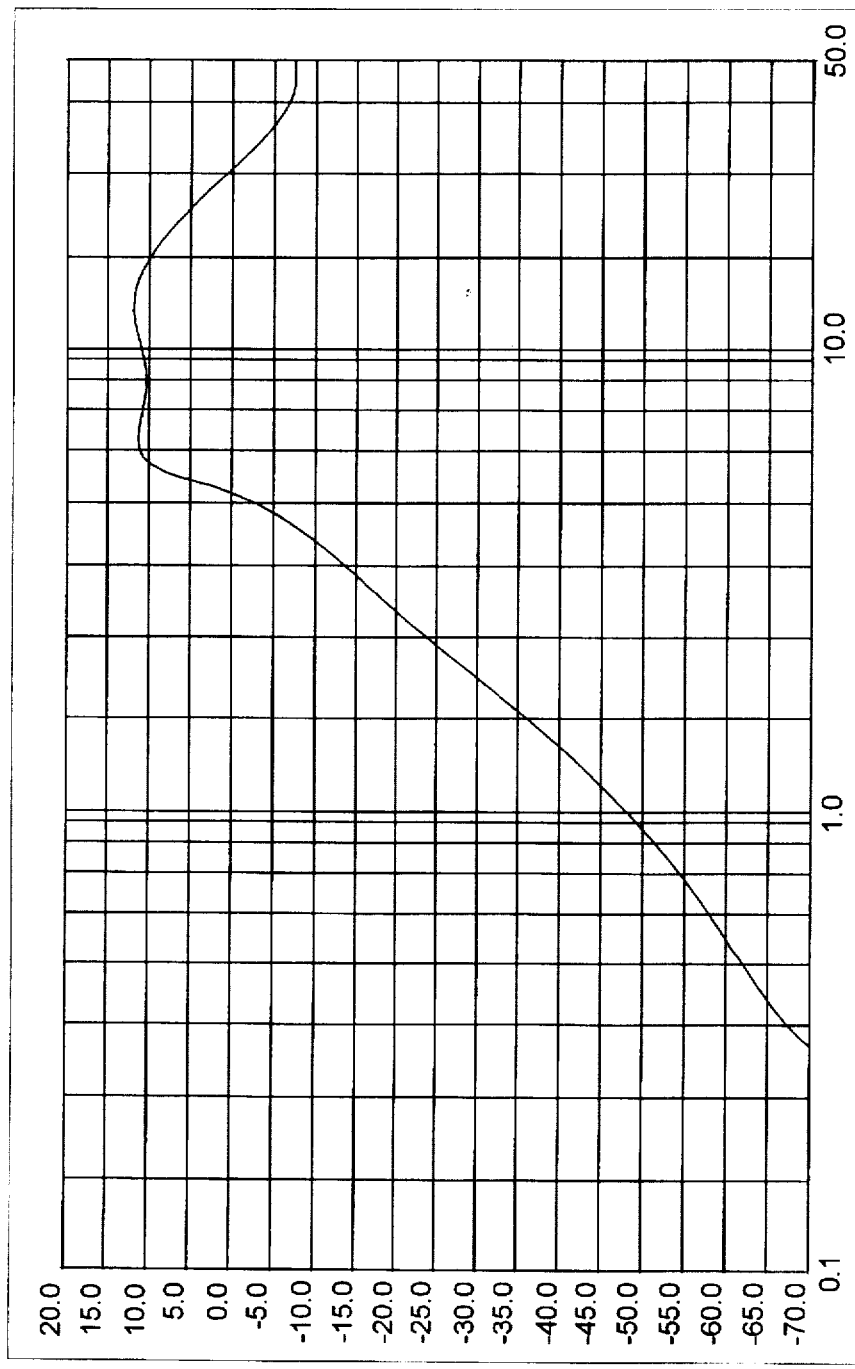
FIG. 2B represents a frequency response of a D/S modulator.
Figure 3:
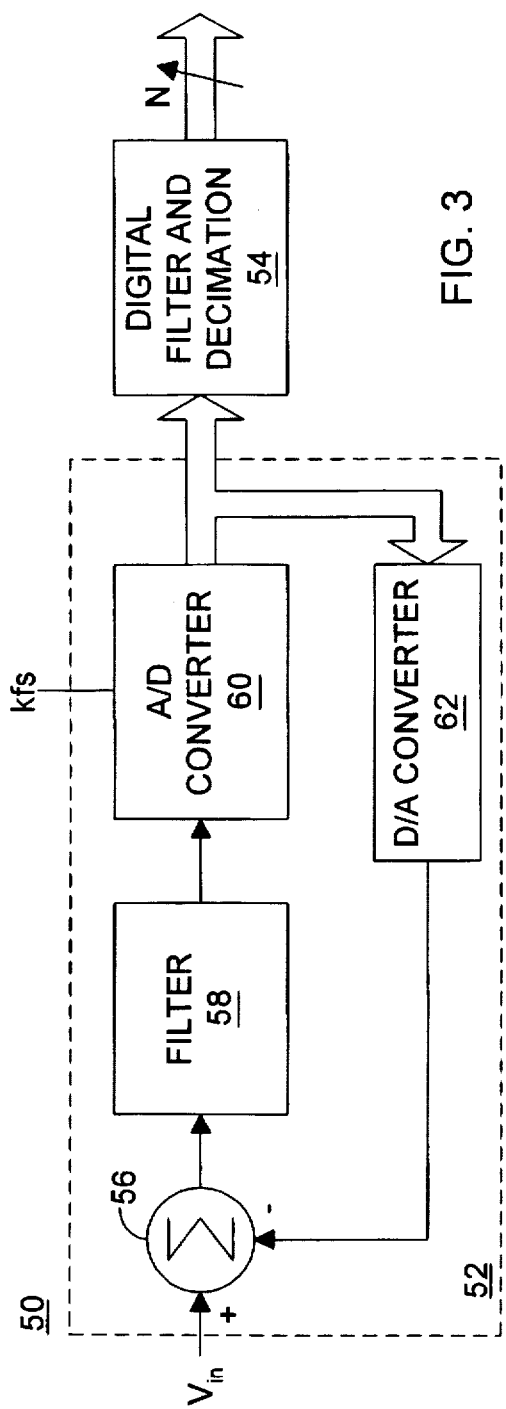
FIG. 3 represents a prior art multi-bit D/S converter in block form.
Figure 5:
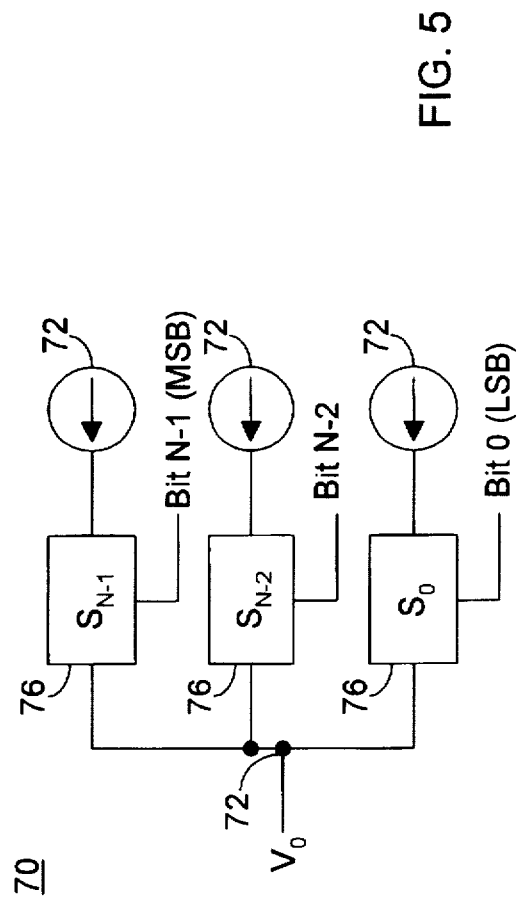
FIG. 5 represents a prior art D/A converter in schematic form.
Figure 4:
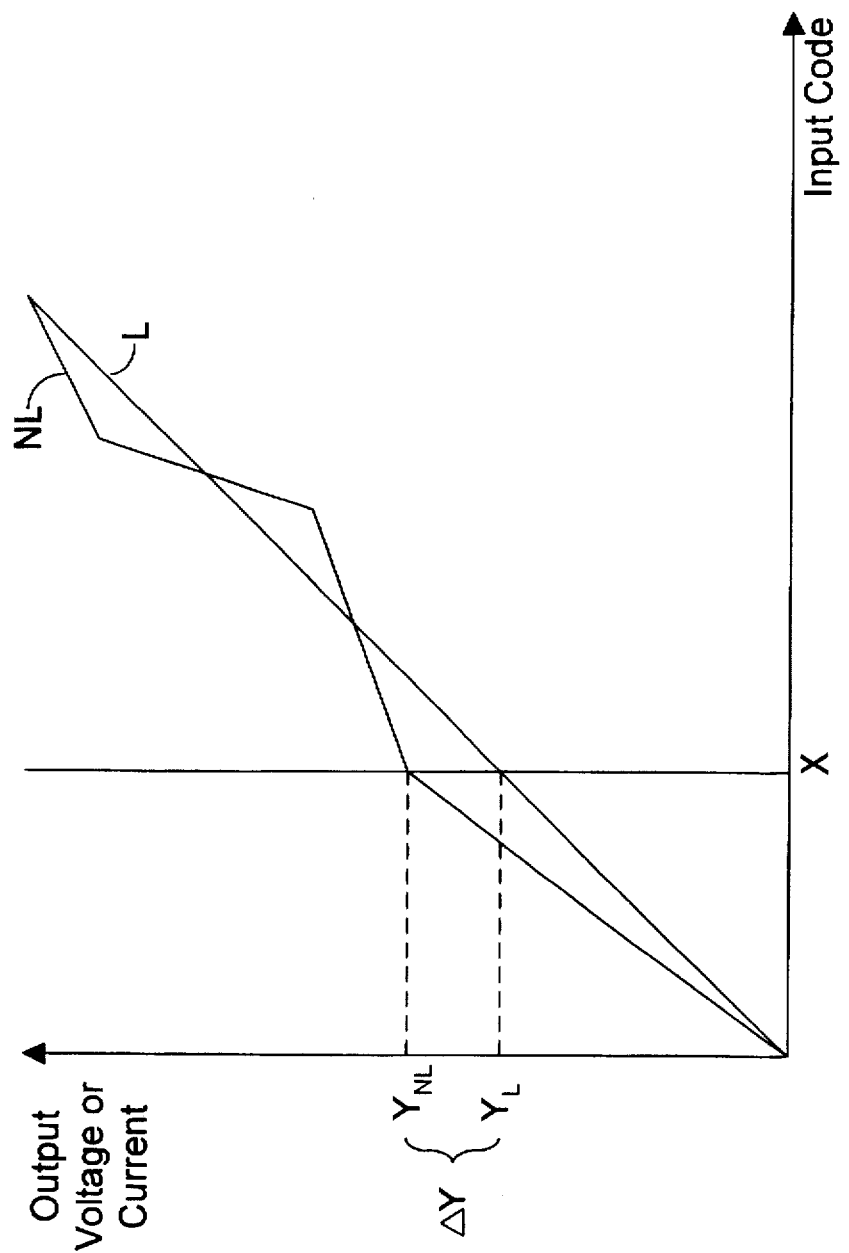
FIG. 4 is a graph representing transfer characteristics of an ideal and a non-ideal multi-bit D/A converter.
Figure 6:
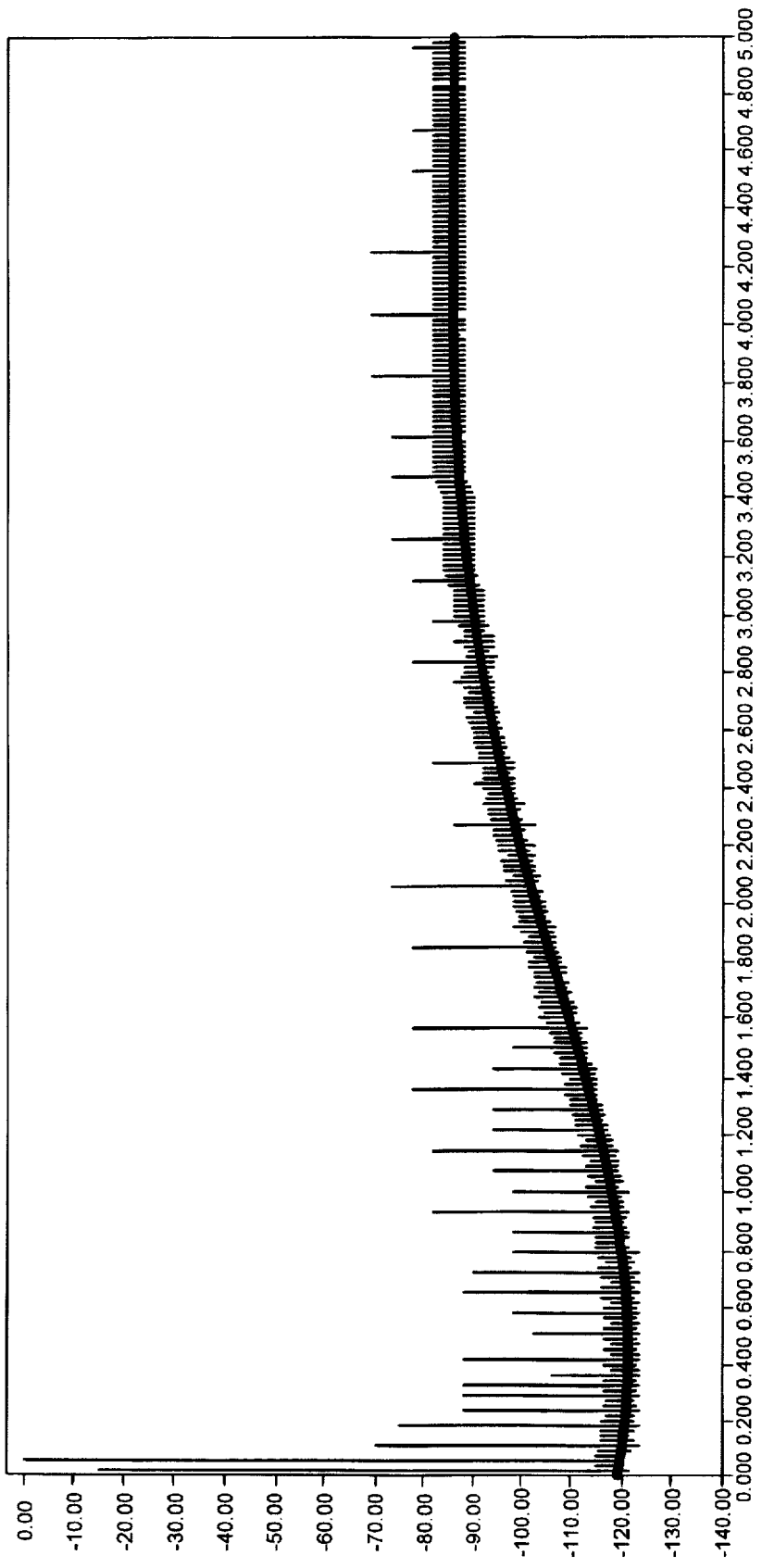
FIG. 6 illustrates the frequency spectrum from a multi-bit D/S converter which has linearity errors.

FIG. 6 represents a FFT by analyzer 100 of digital samples of a 50 kHz sine wave. The y-axis is in dB and the x-axis is in MHz. If the D/S modulator 82 was ideal, FIG. 6 would only exhibit a spike at the frequency 50 kHz and at DC. However, because of the geometrical imperfections of the semiconductor devices which comprise the current generators contained within typical D/A converter, there are many spikes at the low frequency components in FIG. 6. These spikes represent the spectral content of the net linearity error of the D/S modulator 82 in general, and the D/A converter 94 in particular.

At step 126, the programmable digital analyzer 100 separates or extracts the net linearity error spectral content from the frequency domain representation of the digital sample set S. The net linearity error spectral content can be extracted in a plurality of ways.

FIG. 13 shows the preferred procedure for extracting the net linearity error spectral content. At step 160, the D.C. components are removed or otherwise set to zero. At step 162, spectral components around the frequency of the inputted sine wave $f_{SW}$, are removed. The number of bins removed around the fundamental frequency depends on the accuracy of the frequency of the inputted sine wave and the applied window. At step 164, spectral components are removed at the upper part of the spectrum containing quantization noise. At step 168, mirrored spectral components around the half sampling, are removed. This last removal is suggested since FFT spectrum of size N of a real signal contains unique information in half the spectrum. Above half sampling the information is redundant since bins (N/2+1) to (N−1) are mirrors to bins 1 to (N/2−1). If only the spectral content below the half sampling is eliminated, the bins will not be complex conjugated and thus the subsequent inverse FFT will result in a complex (as opposed to a real) time signal. The spectral content remaining after steps 160–168 represents the net linearity error.

Referring again to FIG. 11, at step 128, an inverse frequency domain transform algorithm, preferably a FFT, is applied to the net linearity error spectrum by the programmable digital analyzer 100. This produces a time domain signal, referred to as E, which represents the linearity error. It is noted that the signal E only originates from linearity errors and not from quantization error.

FIG. 12 is a flowchart illustrating how the specific linearity error associated with each current generator of the D/A converter 94 is extracted from subsets s(m). From these specific linearity errors and the net linearity error E, correction coefficients can be designed and subsequently used to correct for linear errors associated with each of the current generators.

With continuing reference to FIG. 8, the programmable digital analyzer 100 sets m= 1 at step 132. Thereafter, in step 134, a subset s(m) of digital samples is selected from memory. An FFT is applied to the selected subset in step 136. The resulting frequency domain representation of the subset s(m) contains linearity error information associated with a particular current generator in the D/A converter 94. This linearity error information, or specific linearity spectrum error, is separated or extracted from the frequency domain representation of subset s(m), in the preferred embodiment, in substantially the same manner as the net linearity error spectrum was extracted from the frequency domain representation of set S of digital samples as shown in FIG. 14. Namely, spectral components are removed from the frequency domain representation of s(m) at the same frequencies at which spectral components were removed from the frequency domain representation of the recorded digital signals S in steps 160–168. Thus, in the preferred embodiment, the subsets s(m) are subjected to substantially the same linear error extraction algorithm which was applied to the recorded digital samples S to obtain the net linearity error spectrum.

The remaining spectral content represents the specific linearity error spectrum. Thereafter, in step 140 in FIG. 12, the programmable digital analyzer 100 applies an inverse Fast Fourier Transform algorithm (FFT) to the specific linearity error spectrum. The resulting time domain values are referred to as specific linearity errors and designated as a(m).

Steps 134–140 are repeated for each individual subset s(m) of digital samples. In the preferred embodiment, steps 134–140 are repeated n times, where n equals the number of current generators contained within the D/A converter 94.

FIG. 14—Generation of Linearity Error Correction Coefficients

FIG. 14 is a flowchart showing how the linearity error correction coefficients c(m) are generated in step 112 of FIG. 9. With continuing reference to FIG. 8 and with further reference to FIG. 14, generation of the linearity error correction coefficients c(m) for m=1 to n−1, will now be explained. At first it should be noted that in the preferred embodiment, only n−1 linearity error correction coefficients need be calculated since one of the current generators (i.e., current generator n) contained within the D/A converter is presumed to be ideal, and the correction coefficient associated with this presumed ideal generator is set to zero. The remaining error correction coefficients are calculated with reference to the presumed ideal current generator.

In steps 142 and 144 respectively, the programmable digital analyzer 100 initially sets each value of c(m) to 0, and sets m=0. Thereafter, in step 146, the programmable digital analyzer 100 increments m by 1. A specific linearity error signal a(m) is then selected at step 148 and multiplied by a value k(m) in order to minimize a power content of:

$$P=E-k(m)a(m),$$

where E is the net linearity error. The selection of the proper k(m) involves solving the above power equation for k(m)= −1, 0, and 1, and; the resulting power values are then used to calculate a and b in accordance with the following equations:

$$a=0.5(P(1)+P(-1))-P(0),$$

and $$b=0.5(P(1)-P(-1)).$$

The value of k(m) which minimizes the power equation is then calculated by:

$$k(m)=-b/2a.$$

Once a suitable value of k(m) has been identified, the programmable digital analyzer 100 replaces the current value of the net linearity error E with what it was before less k(m)a(m) in step 150. In step 152, the programmable digital analyzer 100 replaces the current value of c(m) with the calculated value c(m) plus k(m), i.e., c(m)=c(m)+k(m).

Steps 146 through 152 are repeated for each value of m from 1 to n−1, where n equals the number of current generators within the D/A converter 94. In step 158, the programmable digital analyzer 100 determines whether the current value of E is sufficiently reduced. If E is sufficiently reduced, the process ends. Normally, E has not been sufficiently reduced after a first iteration of steps 144–156. Steps 144–156 are repeated until E has been sufficiently reduced. FIGS. 16–21 shows the power content of E after successive iterations of steps 144–156. As can be seen, the power content reduces with each iteration. It has been found that the iteration defined by steps 144–156 should be generally repeated four to five times in order to sufficiently reduce E.

Calculation of the correction coefficients c(m) was described in the time domain. In other words the correction coefficients were calculated after an inverse frequency domain transformation was applied to the net and specific linearity spectral contents to generate the time domain equivalents E and a(m). The correction coefficients were then calculated using E and a(m). The calculation involved minimizing the power content of E at steps 148 and 158. It is to be understood, however, that the present invention is not to be limited thereto. The present invention also contemplates generating the correction coefficients from the net and specific linearity error spectral contents without transformations of these spectral contents into the time domain. For example the error correction coefficients c(m) can be calculated by iteratively minimizing the spectral content between the net linearity error spectral content and the specific linearity error spectral contents. This alternative embodiment is advantageous in that there is no need to perform an inverse frequency domain transformation after the extraction steps described in FIG. 13.

L/E Correction Circuit Configuration

With the error correction coefficients c(m) fully calculated, the programmable digital analyzer 100 next configures the L/E correction circuit 84 to model the linearity error transfer B of the D/A converter 94. In the preferred embodiment, the digital error correction circuit 84 is defined by an EEPROM or other programmable memory configured as a look-up table (LUT). Entries or output signals o(y) of the look-up table are calculated for each uncorrected digital input signal y. It is to be noted that each input signal y to the LUT is also an input to the internal D/A converter. Thus, each input signal is associated with a particular set of internal D/A converter current generators being active or on. Further, each c(m) is associated with a particular internal D/A converter current. In one embodiment, each output signal o(y) is a summation of the input signal y and the c(m)s corresponding to those current generators of the internal D/A which are active for that input signal. The entries or output signals o(y) are digital signals with reduced linearity errors mapped to uncorrected digital signals outputted by the D/S modulator 82. The LUT comprised in the digital error correction circuit is addressable by the digital signals output by the particular D/S modulator 82. Once properly configured, any digital representation of an analog signal $V_{in}$ inputted into the D/S modulator 82, is corrected or enhanced by the L/E correction circuit 84. Thus the digital output of the D/S modulator 82 is received by the L/E correction circuit 84. The L/E correction circuit 84 uses the received value to index into the LUT to obtain the corrected value with reduced linearity error. Thus, the L/E correction circuit 84 automatically corrects for linearity errors in the digital output of the D/S modulator 82.

In order to save computational time, it is possible to decimate in the frequency domain before application of the inverse FFT. This is accomplished by simply removing bins in the upper spectrum (up to half sampling) that are zero, and removing mirrors of these bins.

As was stated above, the current generators contained within the internal D/A converter 94 may vary with time and temperature. Accordingly, the linearity error associated thereto may likewise vary over time and temperature. Thus, in one embodiment, the L/E circuit 84 may be recalibrated over time and use, in order to account for changing linearity errors. In other words, the L/E circuit 84 is dynamically recalibrated during use. To recalibrate, the programmable digital analyzer 100 generates a new set of correction coefficients c(m) and reconfigures the L/E correction circuit 84 in accordance thereto. In this manner, the resolution of the D/S converter 80 can be maximized throughout its use.

Figure 22:
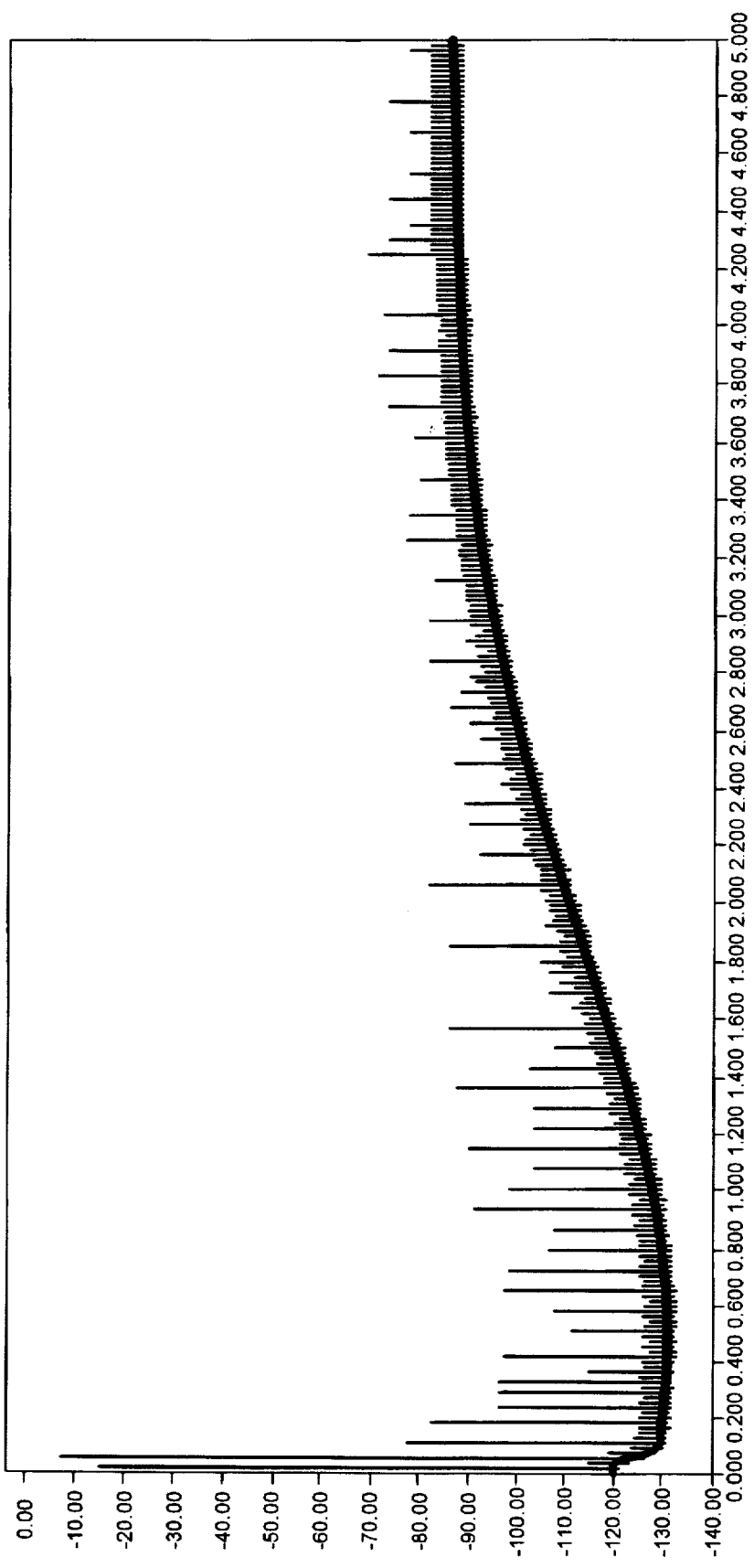
FIG. 22 illustrates a FFT of sine wave digital samples after linearization in accordance with the present invention.

FIG. 22 shows a FFT of linearized digital samples of a 50 kHz sine wave. When compared to FIG. 6, which represents a FFT of the same sine wave without linearization, it can be seen that errors, i.e., the spikes outside of DC and 50 kHz and in the lower frequencies, are reduced significantly (residual errors are probably caused by errors in the sine wave, dynamic errors and errors in various preceding analog stages). This higher precision can be achieved without having to implement expensive, highly precise current generators within the internal D/A converter. In simulations using the present invention, it has been found that the output resolution of the D/S converter 80 can be increased to 18 bits operating at 1 MHz. In the simulations, the resampling rate $f_S$ was 100 MHz.

Numerous variations and modifications will become apparent to those skilled in the art once the above disclosure is fully appreciated. It is intended that the following claims be interpreted to embrace all such variations and modifications.

What is claimed is:

1. A method of constructing a linear error correction circuit for use in a delta-sigma converter, wherein the delta-sigma converter includes a delta-sigma modulator, wherein the delta-sigma modulator includes a D/A converter, the method comprising:

applying an analog waveform to the delta-sigma modulator, wherein the delta-sigma modulator generates digital signals representative thereof;

recording a plurality of the digital signals;

applying a frequency domain transform to the plurality of digital signals to generate a frequency domain representation thereof;

extracting a net linearity error spectrum from the frequency domain representation of the plurality of digital signals;

applying an inverse frequency domain transform to the net linearity error spectrum to generate a net linearity error E;

sorting the plurality of digital signals into n sub-sets, each digital signal in a particular sub-set corresponding to a particular active state of a generator internal to the D/A converter in the delta-sigma modulator;

applying a frequency domain transform to each of the sub-sets of digital signals to generate a frequency domain representation thereof;

extracting a specific linearity error spectrum from each of the frequency domain representations of the sub-sets of digital signals;

generating specific linearity errors a(m) by applying an inverse frequency domain transform to each of the specific linearity error spectrums;

calculating linearity error correction coefficients c(m) as a function of E and a(m):

constructing said linear error correction circuit using the calculated linearity error correction coefficients c(m), wherein said linear error correction circuit is operable to correct linear errors in the delta-sigma modulator.

2. The method of claim 1 further comprising applying a window to the plurality of digital signals after said recording to prevent spectral leakage of noise from high frequencies to low frequencies.

3. The method of claim 1 wherein the extracting the specific linearity error spectrum from each of the frequency domain representative of the sub-sets of digital signals further comprises:

removing a spectral content at zero frequency from each frequency domain representation of the sub-sets of digital signals;

removing a spectral content at a frequency of the analog waveform from each frequency domain representation of the sub-sets of digital signals;

removing a spectral content containing quantization noise from each frequency domain representation of the sub-sets of digital signals.

4. The method of claim 1 wherein the extracting the net linearity error spectrum from the frequency domain representative of the plurality of digital signals further comprises:

removing a spectral content at zero frequency from the frequency domain representation of the plurality of digital signals;

removing a spectral content at a frequency of the analog waveform from the frequency domain representation of the plurality of digital signals, and;

removing a spectral content containing quantization noise from the frequency domain representation of the plurality of digital signals.

5. The method of claim 1, wherein said calculating the linearity error correction coefficients c(m) comprises iteratively minimizing a power content between said net linearity error E and said specific linearity errors a(m) to produce said coefficients c(m).

6. The method of claim 5, wherein said calculating the linearity error correction coefficients c(m) comprises:

a) setting c(m) to zero for each value of m from one to n;
b) setting m to zero;
c) adding one to m;
d) calculating k(m) which minimizes a power content of [E−k(m)a(m)];
e) subtracting k(m)a(m) from E;
f) adding k(m) to c(m);
g) repeating steps c) through f) in sequence until m is greater than n−1;

h) repeating steps b) through g) until E is substantially low.

7. The method of claim 1, wherein the internal D/A converter in the delta-sigma modulator produces linearity errors in the delta-sigma modulator, wherein the method constructs the linearity error correction circuit to correct said linearity errors produced by the internal D/A converter in the delta-sigma modulator.

8. The method of claim 7, wherein the delta-sigma converter is a multi-bit delta-sigma converter, wherein the D/A converter in the delta-sigma modulator includes a plurality of current generators, wherein one or more of said current generators produces linearity errors in the delta-sigma converter, wherein the method constructs the linearity error correction circuit to correct said linearity errors produced by said one or more current generators.

9. The method of claim 8, wherein n represents a number of current generators comprised within the internal D/A converter of the delta-sigma modulator.

10. The method of claim 1, wherein the applied frequency domain transform comprises a Fast Fourier Transform algorithm, and wherein the applied the inverse frequency domain transform comprises an inverse Fast Fourier Transform algorithm.

11. A method of constructing a linear error correction circuit for use in a delta-sigma converter, wherein the delta-sigma converter includes a delta-sigma modulator, wherein the delta-sigma modulator includes a D/A converter, the method comprising:

applying an analog waveform to the delta-sigma modulator, wherein the delta-sigma modulator generates digital signals representative thereof;

recording a plurality of the digital signals;

applying a frequency domain transform to the plurality of digital signals to generate a frequency domain representation thereof;

generating a net linearity error spectrum from the frequency domain representation of the plurality of digital signals;

sorting the plurality of digital signals into n sub-sets, each digital signal in a particular sub-set corresponding to a particular active state of a generator internal to the D/A converter in the delta-sigma modulator;

applying a frequency domain transform algorithm to the sub-sets of digital signals to generate frequency domain equivalents thereof;

generating specific linearity error spectrums from the frequency domain representations of the sub-sets of digital signals;

calculating linearity error correction coefficients as a function of the net linearity error spectrum and the specific linearity spectrums;

constructing said linear error correction circuit using the calculated linearity error correction coefficients, wherein said linear error correction circuit is operable to correct linear errors in the delta-sigma modulator.

12. The method of claim 11, wherein generating net linearity spectrum comprises:

removing a spectral content at zero frequency from the frequency domain representation of the plurality of digital signals;

removing a spectral content at a frequency of the analog waveform from the frequency domain representation of the plurality of digital signals, and;

removing a spectral content containing quantization noise from the frequency domain representation of the plurality of digital signals.

13. The method of claim 11 wherein generating the specific linearity spectrums comprises:

removing a spectral content at zero frequency from each frequency domain representation of the sub-sets of digital signals;

removing a spectral content at a frequency of the analog waveform from each frequency domain representation of the sub-sets of digital signals;

removing a spectral content containing quantization noise from each frequency domain representation of the sub-sets of digital signals.

14. The method of claim 11 wherein calculating the linearity error correction coefficients includes iteratively minimizing spectral content between said net linearity error spectrum and said specific linearity error spectrums to produce said coefficients.

15. The method of claim 12 wherein said calculating the linearity correction coefficients comprises:

a) initially setting the correction coefficients to zero;

b) selecting one of the correction coefficients;

c) calculating a weighting value which when multiplied by one of the specific linearity error spectrums, produces a weighted specific linearity error spectrum, wherein the weighted specific linearity error spectrum minimizes the net linearity error spectrum when the weighted specific linearity error spectrum is subtracted therefrom;

d) subtracting the weighted specific linearity error spectrum from the net linearity error spectrum;

e) adding the weighting value to the selected correction coefficient.

16. The method of claim 11 further comprising applying a window to the plurality of digital signals after said recording to prevent spectral leakage of noise from high frequencies to low frequencies.

17. A method of constructing a linear error correction circuit for use in a delta-sigma converter, wherein the delta-sigma converter includes a delta-sigma modulator, wherein the delta-sigma modulator includes a D/A converter, the method comprising:

applying an analog waveform to the delta-sigma modulator, wherein the delta-sigma modulator generates digital signals representative thereof;

recording a plurality of the digital signals;

generating a net linearity error signal from the plurality of digital signals;

sorting the plurality of digital signals into n sub-sets, each digital signal in a particular sub-set corresponding to a particular active state of a generator internal to the D/A converter in the delta-sigma modulator;

generating specific linearity error signals from the sub-sets of digital signals;

calculating linearity error correction coefficients as a function of the net linearity error signal and the specific linearity error signals;

constructing said linear error correction circuit using the calculated linearity error correction coefficients, wherein said linear error correction circuit is operable to correct linear errors in the delta-sigma modulator.

18. A method of constructing a linear error correcting circuit, the method comprising the steps of:

applying an analog waveform to a delta-sigma modulator, wherein the delta-sigma modulator generates digital signals representative thereof;

recording a plurality of the digital signals;

generating linearity error information from the plurality of the digital signals;

calculating linearity error correction coefficients $c(m)$ as a function of the linearity error information;

constructing said linear error correction circuit using the calculated linearity error correction coefficients.

19. The method of claim 18 wherein said generating linearity error information comprises:

generating a net linearity error E from the plurality of digital signals;

sorting the plurality of digital signals into n sub-sets, each digital signal in a particular sub-set corresponding to a particular active state of a generator internal to the D/A converter in the delta-sigma modulator; and generating specific linearity errors $a(m)$ from the sub-sets of digital signals, wherein said linearity error corrections coefficients $c(m)$ are calculated as a function of the net linearity error E and the specific linearity errors $a(m)$.

20. The method of claim 19 wherein said generating the net linearity error E comprises:

applying a frequency domain transform algorithm to the plurality of digital signals to generate a frequency domain representation thereof;

extracting a net linearity error spectrum from the frequency domain representation of the plurality of digital signals;

applying an inverse frequency domain transform algorithm to the net linearity error spectrum to generate the net linearity error E.

21. The method of claim 20 wherein generating the specific linearity errors $a(m)$ comprises:

applying a frequency domain transform algorithm to the sub-sets of digital signals to generate a frequency domain equivalent thereof;

extracting specific linearity error spectrums from the frequency domain representations of the sub-sets of digital signals;

generating specific linearity errors $a(m)$ by applying an inverse frequency domain transform algorithm to the specific linearity error spectrums.

22. The method of claim 21 further comprising applying a window to the plurality of digital signals to prevent spectral leakage of noise from high frequencies to low frequencies.

23. The method of claim 22 wherein the extracting net and specific linearity error spectrums further comprises the steps of:

removing spectral content at zero frequency from the frequency domain representations of the plurality of digital signals and the sub-sets of digital signals;

removing spectral content at a frequency of the analog waveform from the frequency domain representations of the plurality of digital signals and the sub-sets of digital signals;

removing spectral content from a range of frequencies containing quantization noise from the frequency domain representations of the plurality of digital signals and the sub-sets of digital signals.

24. The method of claim 23, wherein said calculating the linearity error correction coefficients $c(m)$ comprises iteratively minimizing a power content between said net linearity error E and said specific linearity errors $a(m)$ to produce said coefficients $c(m)$.

25. The method of claim 24 wherein calculating the correction coefficients c(m) comprises:
   a) setting c(m) to zero for each value of m from one to n;
   b) setting m to zero;
   c) adding one to m;
   d) calculating k(m) which minimizes a power content of [E−k(m)a(m)];
   e) subtracting k(m)a(m) from E;
   f) adding k(m) to c(m);
   g) repeating steps c) through f) in sequence until m is greater than n−1;
   h) repeating steps b) through g) until E is substantially low.

26. The method of claim 25 wherein n represents a number of current generators contained within an internal D/A converter of the delta-sigma modulator.

27. An apparatus for calibrating a linear error reduction circuit, the apparatus comprising:
   an analog waveform generator connectable to an input of a delta-sigma modulator, wherein the delta-sigma modulator generates digital signals representative of an analog waveform when the delta-sigma modulator is connected to the analog waveform generator;
   a programmable digital analyzer connectable to the delta-sigma modulator, the programmable digital analyzer comprising;
      a first memory for storing a plurality o digital signals representative of the analog waveform;
      a general purpose computer in data communication with the first memory, for calibrating the linear error correction circuit as a function of the plurality of digital signals.

28. The apparatus of claim 27 wherein the general purpose computer includes:
   a linearity error signal generator, for generating linearity error signals as a function of the plurality of digital signals;
   a linearity error coefficient generator, for deriving linearity error coefficients as a function of the linearity error signals;
   a calibration circuit for calibrating the linear error reduction circuit as a function of the linearity error coefficients.

29. The apparatus of claim 28 wherein the programmable digital analyzer further includes a second memory for storing the plurality of digital signals sorted into subsets, wherein each digital signal in a particular sub-set corresponds to a particular active state of a generator internal to the D/A converter in the delta-sigma modulator, and wherein the linearity error signal generator generates (1) a net linearity error signal as a function of the plurality of digital signals, (2) specific linearity error signals as a function of the subsets of the plurality of digital signals.

30. The apparatus of claim 29 wherein the wherein the linearity error signal generator further includes:
   a frequency domain transformer for (1) transforming the plurality of digital signals into a frequency domain representation thereof, and (2) transforming the subsets of digital signals into frequency domain representations thereof;
   an error spectrum extraction circuit for extracting (1) a net linearity error spectrum from the frequency domain representation of the plurality of digital signals, and (2) specific linearity error spectrums from the frequency domain representations of the subsets of digital signals, and;
   an inverse frequency domain transformer for (1) inverse transforming the net linearity error spectrum into the net linearity signal, and (2) inverse transforming the specific linearity error spectrums into the specific linearity signals.

31. The apparatus of claim 30 wherein the programmable digital analyzer further includes a convolution circuit for convolving the plurality of digital signals with a Hanning window prevent spectral leakage of noise from high frequencies to low frequencies.

32. The apparatus of claim 31 wherein the error spectrum extraction circuit removes spectral content from the net linearity spectrum and the specific linearity spectrums at (1) zero frequency, (2) a frequency of the analog waveform, and (3) a range of frequencies containing quantization noise.

33. The apparatus of claim 32 wherein the analog waveform generator comprises a sinewave generator.

34. A method for constructing a linear error correction circuit for use in a multi-bit delta-sigma converter, the method comprising:
   applying an analog waveform to the delta-sigma converter, wherein the delta-sigma converter generates output digital signals representative thereof;
   recording a plurality of the output digital signals;
   generating linearity error information from the plurality of the output digital signals;
   calculating linearity error correction coefficients c(m) in response to the linearity error information; and
   constructing the linear error correction circuit using said linearity error correction coefficients c(m).

35. The method of claim 34, wherein said constructing the linear error correction circuit comprises:
   generating a plurality of first digital signals from the linearity error correction coefficients c(m);
   constructing said linear error correction circuit using said plurality of first digital signals.

36. The method of claim 35, wherein said constructing said linear error correction circuit comprises configuring a look-up table including said plurality of first digital signals;
   wherein said plurality of first digital signals are addressable by an output of the delta-sigma converter.

37. The method of claim 36, wherein the delta-sigma converter is operable to convert an input analog signal into an output digital signal, wherein the output digital signal includes linearity errors;
   wherein the linear error correction circuit is operable to translate the output digital signal into one of said plurality of first digital signals, where said one of said plurality of first digital signals has reduced linearity errors when compared to the first linearity errors in the first digital signal.

38. The method of claim 35, wherein the delta-sigma converter includes a D/A converter, wherein said D/A converter includes a plurality of current generators, wherein one or more of said current generators produces linearity errors in the delta-sigma converter, wherein each of said linearity error correction coefficients c(m) corresponds to a particular active state of a generator internal to the D/A converter in the delta-sigma converter.

39. The method of claim 38, wherein the plurality of first digital signals are generated as a function of said error correction coefficients c(m) for each value of m from 1 to n,
   wherein said generating linearity error information comprises:
      sorting the plurality of output digital signals into n subsets, each output digital signal in a particular

19 sub-set corresponding to a particular active state of a generator internal to the D/A converter in the delta-sigma converter;

generating specific linearity errors a(m) from the sub-sets of output digital signals;

wherein said linearity error correction coefficients c(m) are calculated as a function of the specific linearity errors a(m).

40. The method of claim 39, wherein said generating specific linearity errors a(m) comprises:

applying a frequency domain transform algorithm to the sub-sets of output digital signals to generate a frequency domain equivalent thereof;

extracting specific linearity error spectrums from the frequency domain representations of the sub-sets of output digital signals;

generating the specific linearity errors a(m) by applying an inverse frequency domain transform algorithm to the specific linearity error spectrums.

41. The method of claim 40, wherein the extracting the specific linearity error spectrums comprises:

removing spectral content at zero frequency from the frequency domain representations of the sub-sets of digital signals;

removing spectral content at a frequency of the analog waveform from the frequency domain representations of the sub-sets of output digital signals; and removing spectral content from a range of frequencies containing quantization noise from the frequency domain representations of the sub-sets of output digital signals.

42. The method of claim 39, wherein said generating linearity error information further comprises:

generating a net linearity error E from the plurality of output digital signals;

wherein said linearity error correction coefficients c(m) are calculated as a function of the specific linearity errors a(m) and said net linearity error E.

43. The method of claim 42, wherein said generating the net linearity error E comprises:

applying a frequency domain transform algorithm to the plurality of output digital signals to generate a frequency domain representation thereof;

extracting a net linearity error spectrum from the frequency domain representation of the plurality of output digital signals;

applying an inverse frequency domain transform algorithm to the net linearity error spectrum to generate the net linearity error E.

44. The method of claim 43, wherein the extracting the net linearity error spectrum comprises:

removing spectral content at zero frequency from the frequency domain representations of the plurality of output digital signals;

removing spectral content at a frequency of the analog waveform from the frequency domain representations of the plurality of output digital signals;

removing spectral content from a range of frequencies containing quantization noise from the frequency domain representations of the plurality of output digital signals.

45. The method of claim 42, wherein calculating the correction coefficients c(m) comprises iteratively minimizing a power content between said net linearity error E and said specific linearity errors a(m) to produce said coefficients c(m).

20

46. The method of claim 45, wherein calculating the correction coefficients c(m) comprises:

a) setting c(m) to zero for each value of m from one to n;
b) setting m to zero;
c) adding one to m;
d) calculating k(m) which minimizes a power content of |E−k(m)a(m)|;
e) subtracting k(m)a(m) from E;
f) adding k(m) to c(m);
g) repeating steps c) through f) in sequence until m is greater than n−1;
h) repeating steps b) through g) until E is substantially low.

47. The method of claim 38, wherein n represents a number of current generators contained within an internal D/A converter of the delta-sigma converter.

48. The method of claim 38, wherein the plurality of first digital signals are generated as a function of said error correction coefficients c(m) for each value of m from 1 to n, wherein said generating linearity error information comprises:

sorting the plurality of output digital signals into n subsets, each output digital signal in a particular sub-set corresponding to a particular active state of a generator internal to the D/A converter in the delta-sigma converter;

generating specific linearity spectrums from the sub-sets of output digital signals;

wherein said linearity error correction coefficients c(m) are calculated as a function of the specific linearity spectrums.

49. The method of claim 48, wherein said generating the specific linearity errors a(m) comprises:

applying a frequency domain transform algorithm to the sub-sets of output digital signals to generate a frequency domain equivalent thereof;

extracting the specific linearity error spectrums from the frequency domain representations of the sub-sets of output digital signals.

50. The method of claim 49, wherein the extracting the specific linearity error spectrums comprises:

removing spectral content at zero frequency from the frequency domain representations of the sub-sets of digital signals;

removing spectral content at a frequency of the analog waveform from the frequency domain representations of the sub-sets of output digital signals; and removing spectral content from a range of frequencies containing quantization noise from the frequency domain representations of the sub-sets of output digital signals.

51. The method of claim 48, wherein said generating linearity error information further comprises:

generating a net linearity error spectrum from the plurality of output digital signals;

wherein said linearity error correction coefficients c(m) are calculated as a function of the specific linearity error spectrums and said net linearity error spectrum.

52. The method of claim 51, wherein said generating the net linearity error spectrum comprises:

applying a frequency domain transform algorithm to the plurality of output digital signals to generate a frequency domain representation thereof;

extracting a net linearity error spectrum from the frequency domain representation of the plurality of output digital signals.

53. The method of claim 52, wherein the extracting the net linearity error spectrum comprises:

removing spectral content at zero frequency from the frequency domain representations of the plurality of output digital signals;

removing spectral content at a frequency of the analog waveform from the frequency domain representations of the plurality of output digital signals;

removing spectral content from a range of frequencies containing quantization noise from the frequency domain representations of the plurality of output digital signals.

54. The method of claim 51, wherein calculating the correction coefficients c(m) comprises iteratively minimizing a spectral content between said net linearity error spectrum and said specific linearity error spectrums to produce said coefficients c(m).

55. The method of claim 38, wherein said translating comprises indexing into a look-up table addressable by the first digital signal.

56. A system for generating a linear error correction circuit for use in a multi-bit delta-sigma converter, the system comprising:

an analog waveform generator selectively connected to the delta-sigma converter for providing an analog waveform to the delta-sigma converter, wherein the delta-sigma converter generates output digital signals representative of the analog waveform generated by the analog waveform generator when the analog waveform generator is connected to the delta-sigma converter;

a programmable digital signal analyzer in selective data communication with the linear error correction circuit and operable to be coupled to the delta-sigma converter for generating a plurality of first digital signals, wherein the programmable digital analyzer includes:

a first memory for storing the plurality of output digital signals representative of the analog waveform digital signals outputted by the delta-sigma converter; and a computer in data communication with the first memory, for calculating the first digital signal from the plurality of output digital signals, wherein the computer is operable to generate linearity error information from the plurality of the output digital signals, calculate linearity error correction coefficients c(m) as a function of the linearity error information, and generate the plurality of first digital signals from the linearity error correction coefficients c(m);

wherein the plurality of first digital signals are useable in configuring the linear error correction circuit.

57. The system of claim 56, wherein the delta-sigma converter includes a D/A converter, wherein said D/A converter includes a plurality of current generators, wherein one or more of said current generators produces linearity errors in the delta-sigma converter, wherein each of said linearity error correction coefficients c(m) corresponds to a particular active state of a generator internal to the D/A converter in the delta-sigma converter.

58. The system of claim 57, wherein the plurality of first digital signals are generated as a function of said error correction coefficients c(m) for each value of m from 1 to n, wherein, in generating said linearity error information, the computer is operable to sort the plurality of output digital signals into n subsets, each output digital signal in a particular sub-set corresponding to a particular active state of a generator internal to the D/A converter in the delta-sigma converter, wherein the computer generates specific linearity errors a(m) from the sub-sets of output digital signals;

wherein said linearity error correction coefficients c(m) are calculated as a function of the specific linearity errors a(m).

59. The system of claim 57, wherein the plurality of first digital signals are generated as a function of said error correction coefficients c(m) for each value of m from 1 to n, wherein, in generating said linearity error information, the computer is operable to sort the plurality of output digital signals into n subsets, each output digital signal in a particular sub-set corresponding to a particular active state of a generator internal to the D/A converter in the delta-sigma converter, wherein the computer generates specific linearity error spectrums from the sub-sets of output digital signals;

wherein said linearity error correction coefficients c(m) are calculated as a function of the specific linearity error spectrums.

\* \* \* \* \*

UNITED STATES PATENT AND TRADEMARK OFFICE
CERTIFICATE OF CORRECTION

PATENT NO. : 5,781,138
DATED : July 14, 1998
INVENTOR(S) : Niels Knudsen

It is certified that error appears in the above-identified patent and that said Letters Patent is hereby corrected as shown below:

In claim 10, column 14, , line 21, after "applied" delete [the].

In claim 27, column 17, line 27, after "plurality" delete [o] and insert --of--.

In claim 30, column 17, line 54, after "claim 29 wherein" delete [the wherein].

In claim 31, column 18, line 9, after "window" insert --to--.

In claim 37, column 18, line 50, after "compared to the" delete [first].

In claim 37, column 18, line 51, before "digital" delete [first].

Signed and Sealed this

Twelfth Day of January, 1999

Attest:

Attesting Officer

*Acting Commissioner of Patents and Trademarks*